(12) United States Patent
Chen et al.

(10) Patent No.: US 10,453,764 B2
(45) Date of Patent: Oct. 22, 2019

(54) MOLDING FOR LARGE PANEL FAN-OUT PACKAGE

(71) Applicant: Advanced Semiconductor Engineering, Inc., Kaohsiung (TW)

(72) Inventors: Shao-An Chen, Kaohsiung (TW); Po-Wei Lu, Kaohsiung (TW); Ming Tsung Shen, Kaohsiung (TW); Yu-Tzu Peng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/675,610

(22) Filed: Aug. 11, 2017

(65) Prior Publication Data
US 2018/0047651 A1    Feb. 15, 2018

Related U.S. Application Data

(60) Provisional application No. 62/382,064, filed on Aug. 31, 2016, provisional application No. 62/374,558, filed on Aug. 12, 2016, provisional application No. 62/373,759, filed on Aug. 11, 2016.

(51) Int. Cl.
*H01L 23/31* (2006.01)
*H01L 21/56* (2006.01)
*H01L 23/00* (2006.01)
*H01L 23/538* (2006.01)

(52) U.S. Cl.
CPC ........ *H01L 23/3114* (2013.01); *H01L 21/561* (2013.01); *H01L 21/568* (2013.01); *H01L 23/3128* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/565* (2013.01); *H01L 23/562* (2013.01); *H01L 2224/04105* (2013.01); *H01L 2224/12105* (2013.01); *H01L 2224/16227* (2013.01); *H01L 2224/18* (2013.01); *H01L 2224/214* (2013.01); *H01L 2224/32225* (2013.01); *H01L 2224/73204* (2013.01); *H01L 2224/73267* (2013.01); *H01L 2224/81005* (2013.01); *H01L 2224/83005* (2013.01); *H01L 2224/9222* (2013.01); *H01L 2224/95001* (2013.01); *H01L 2224/97* (2013.01); *H01L 2924/15311* (2013.01);
(Continued)

(58) Field of Classification Search
CPC .................................................. H01L 2924/181
See application file for complete search history.

(56) References Cited

U.S. PATENT DOCUMENTS 5,362,666 A * 11/1994 Dennison .......... H01L 27/10817
257/E27.089
8,021,930 B2   9/2011 Pagaila
8,367,480 B2   2/2013 Pagaila
(Continued)

*Primary Examiner* — Thao P Le
(74) *Attorney, Agent, or Firm* — Foley & Lardner LLP; Cliff Z. Liu

(57) ABSTRACT

The present disclosure relates to wafer level packages including one or more semiconductor dies and a method of manufacturing the same. A method comprises: providing a carrier having a predetermined area, disposing a semiconductor device on the predetermined area, and forming a sacrificial wall on a periphery of the predetermined area.

19 Claims, 43 Drawing Sheets

(52) U.S. Cl.
CPC ............... *H01L 2924/1815* (2013.01); *H01L 2924/18162* (2013.01); *H01L 2924/3511* (2013.01)

(56) References Cited

U.S. PATENT DOCUMENTS

| | | |
|---|---|---|
| 9,281,259 B2 | 3/2016 | Lin et al. |
| 9,345,184 B2 * | 5/2016 | Oster .................... H01L 23/552 |
| 2003/0151063 A1 * | 8/2003 | Kobayashi ........ H01L 29/42316 257/192 |
| 2008/0085612 A1 * | 4/2008 | Smythe ............. H01L 21/02164 438/787 |
| 2010/0309101 A1 * | 12/2010 | Kanegae ............ H01L 27/3246 345/76 |
| 2012/0040528 A1 * | 2/2012 | Kim ................. H01L 21/76816 438/675 |

\* cited by examiner

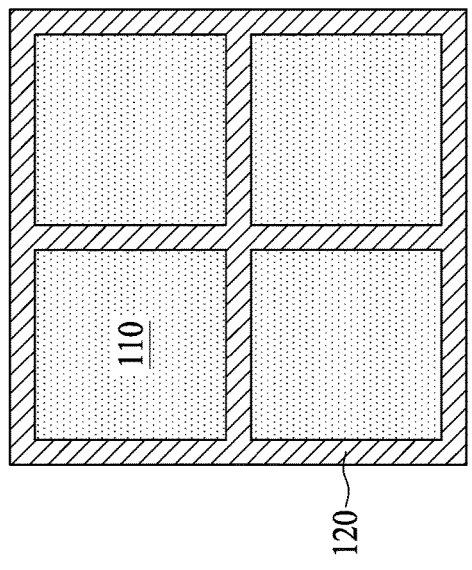
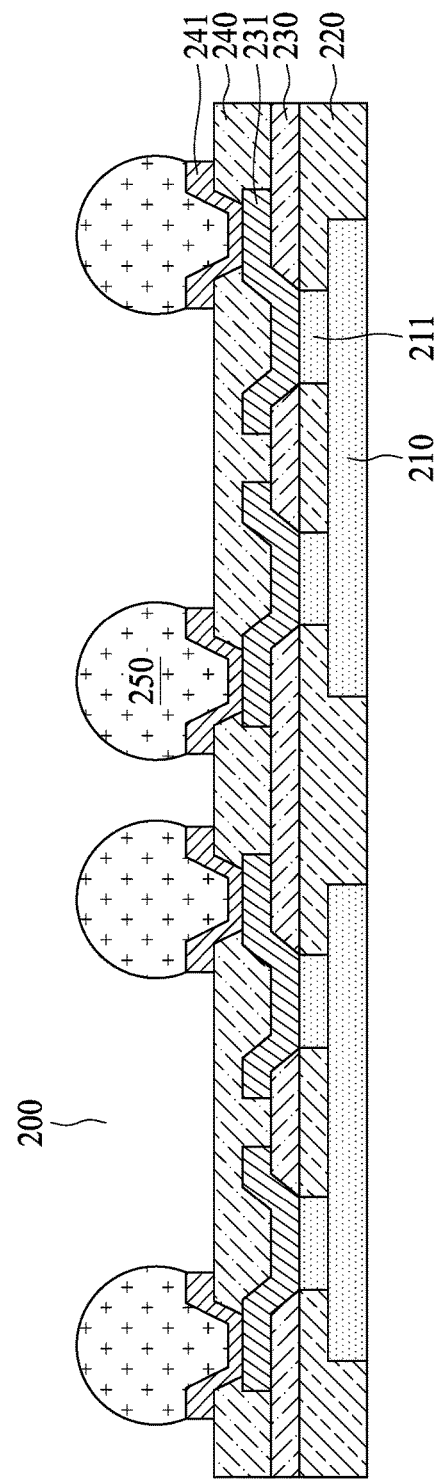
FIG. 1
FIG. 2

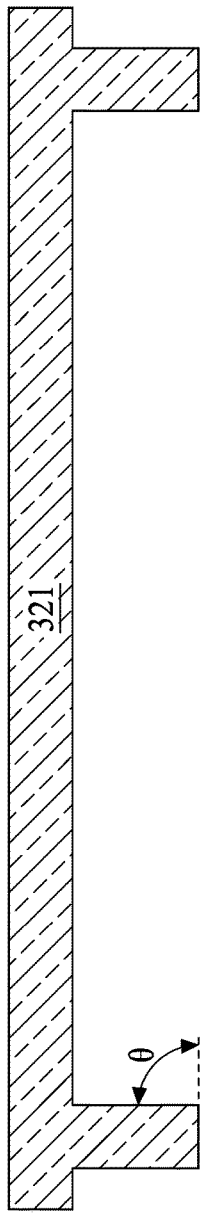
FIG. 3B'
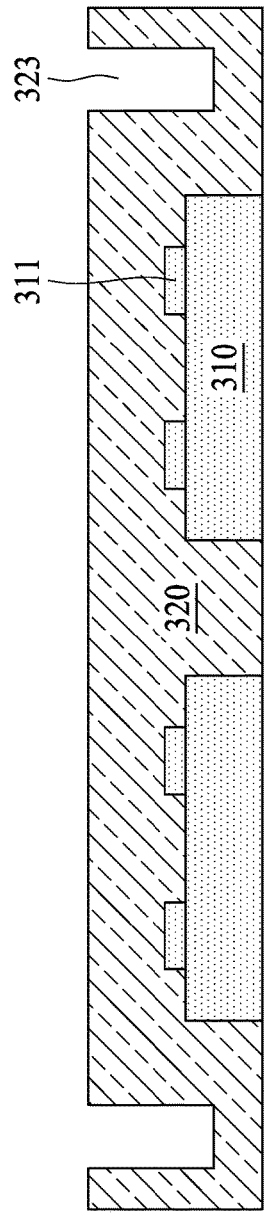
FIG. 3C
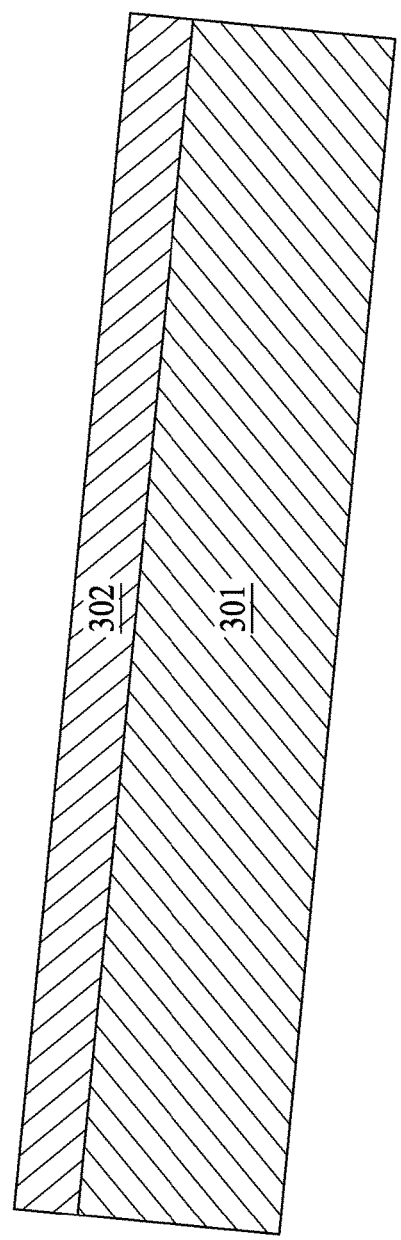

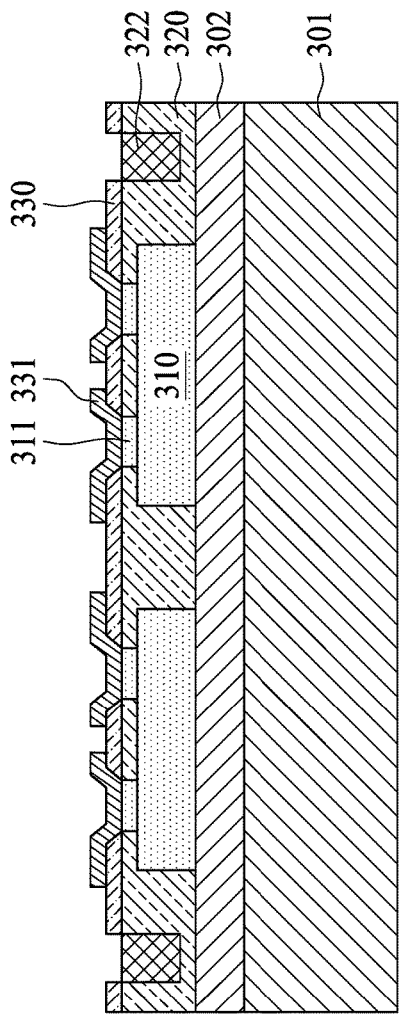
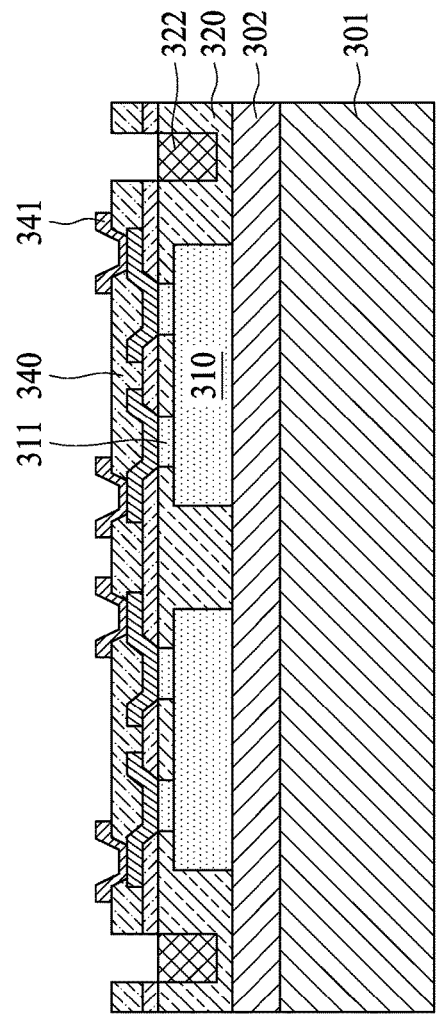
FIG. 4A
FIG. 4B

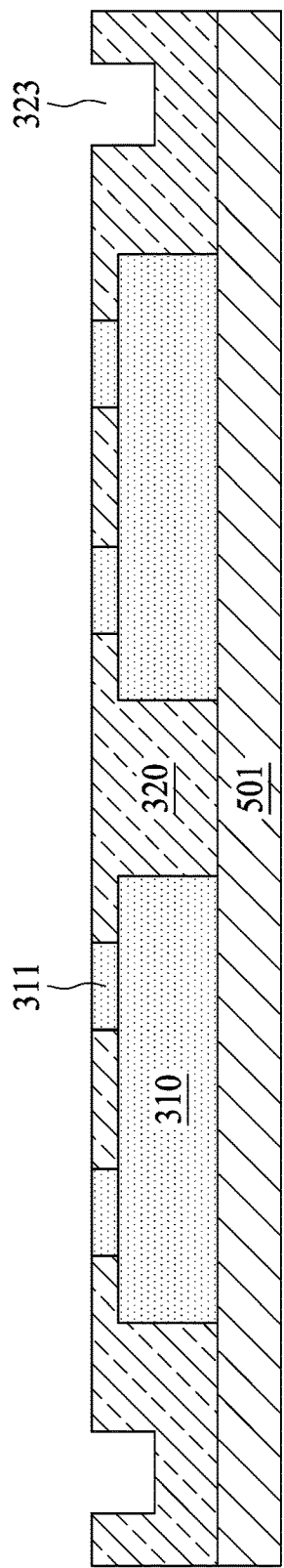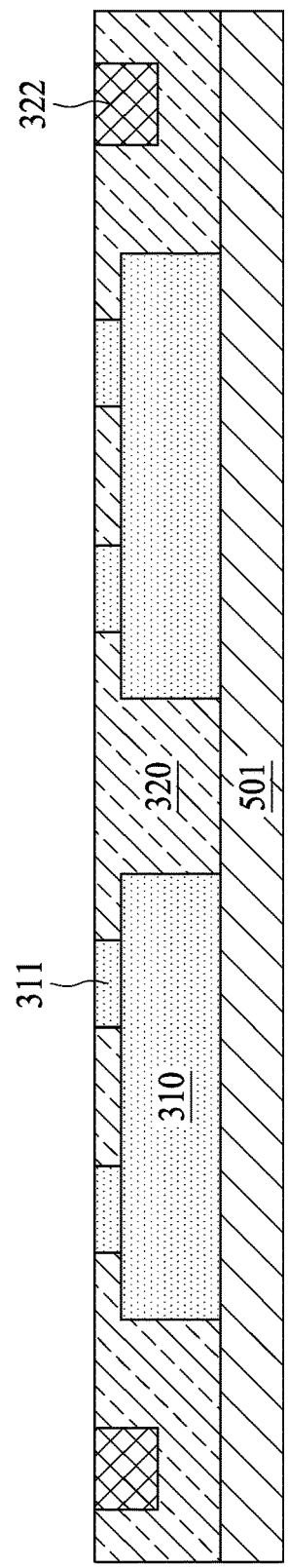
FIG. 5A
FIG. 5B

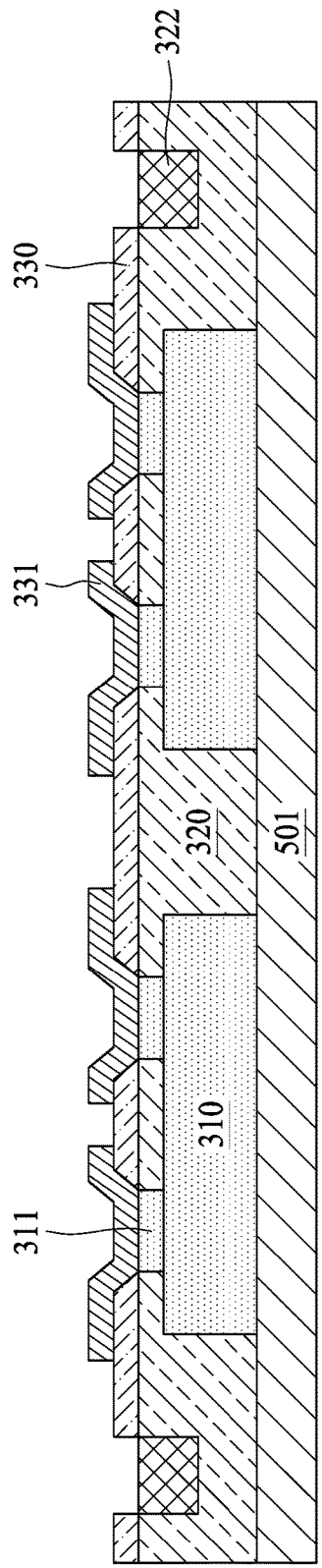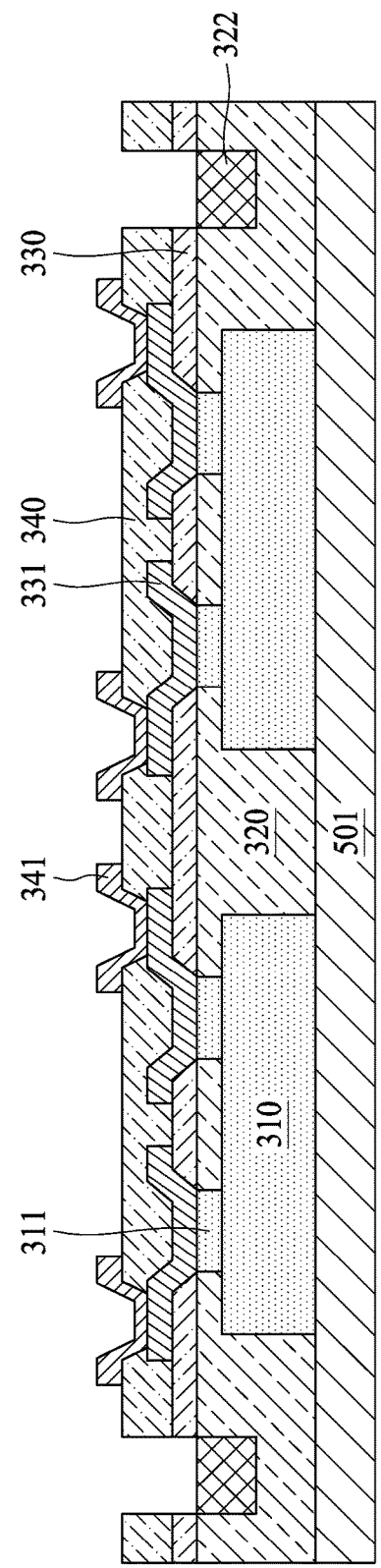
FIG. 5C
FIG. 5D

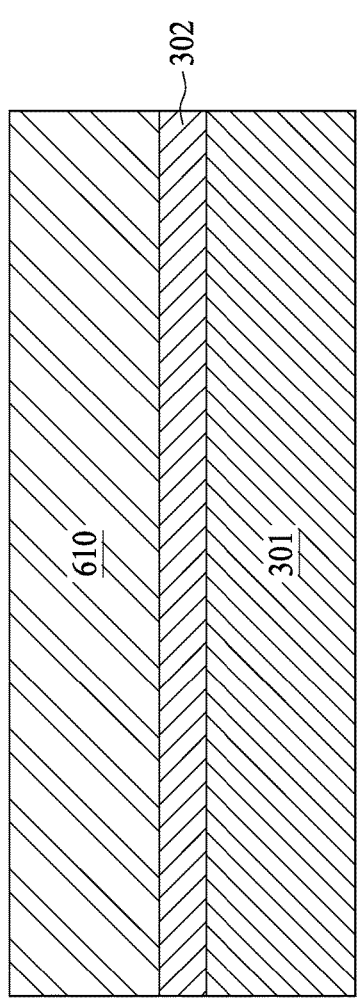
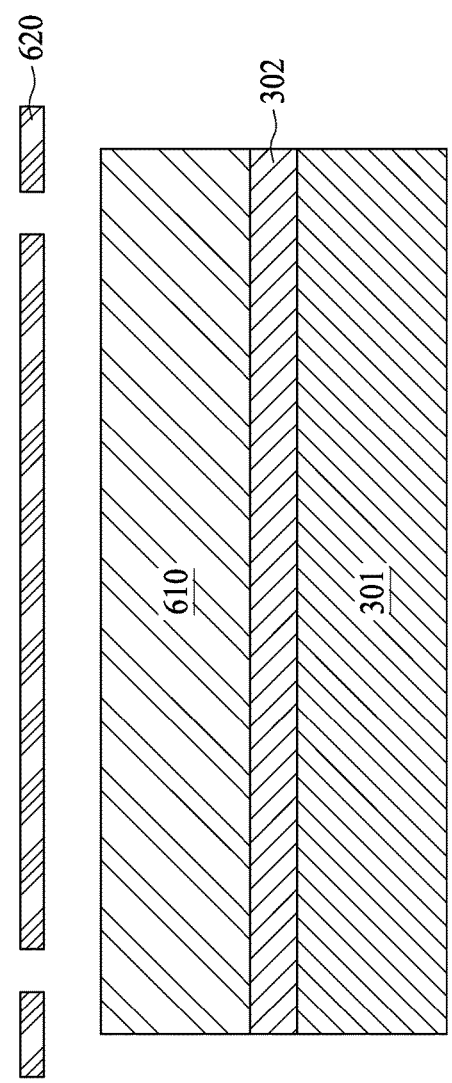
FIG. 6A
FIG. 6B

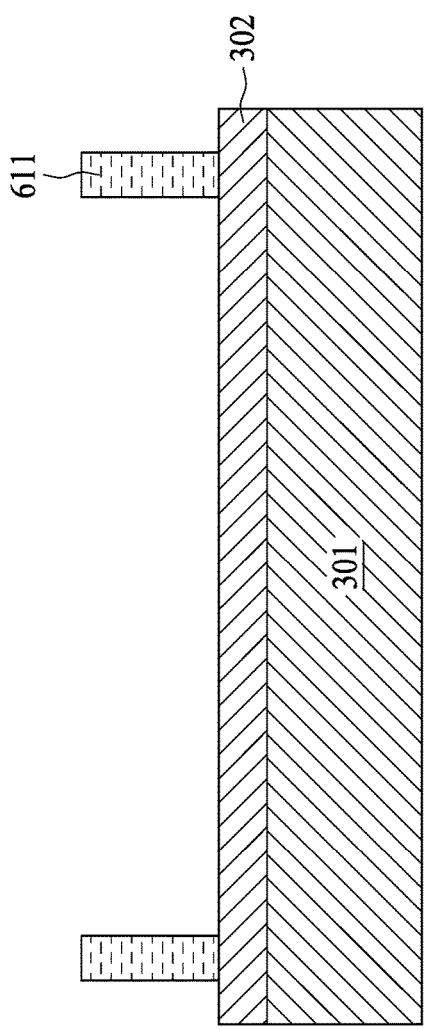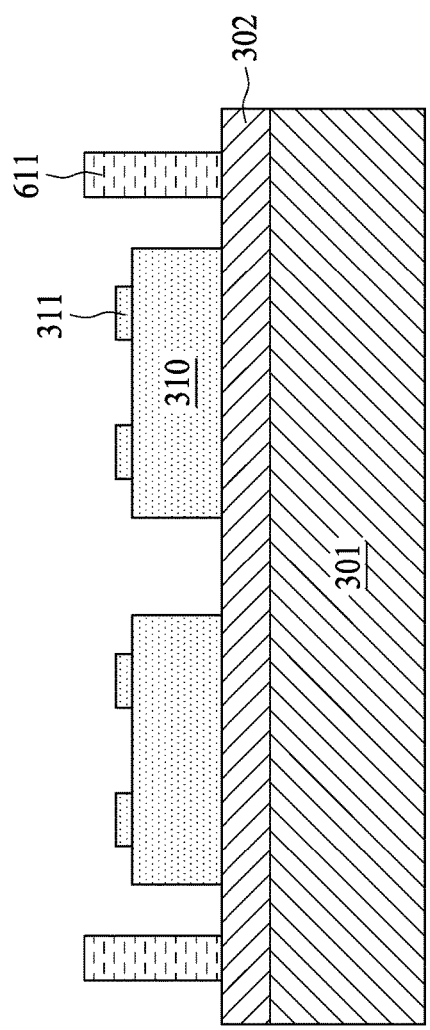

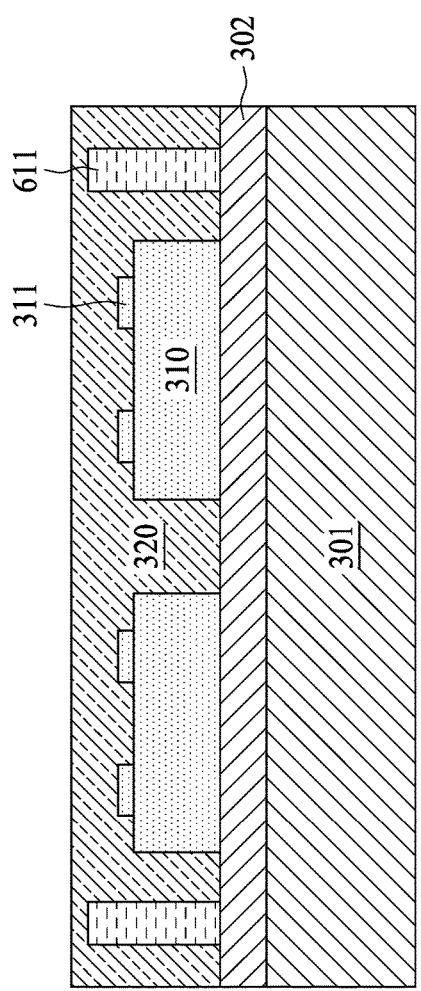
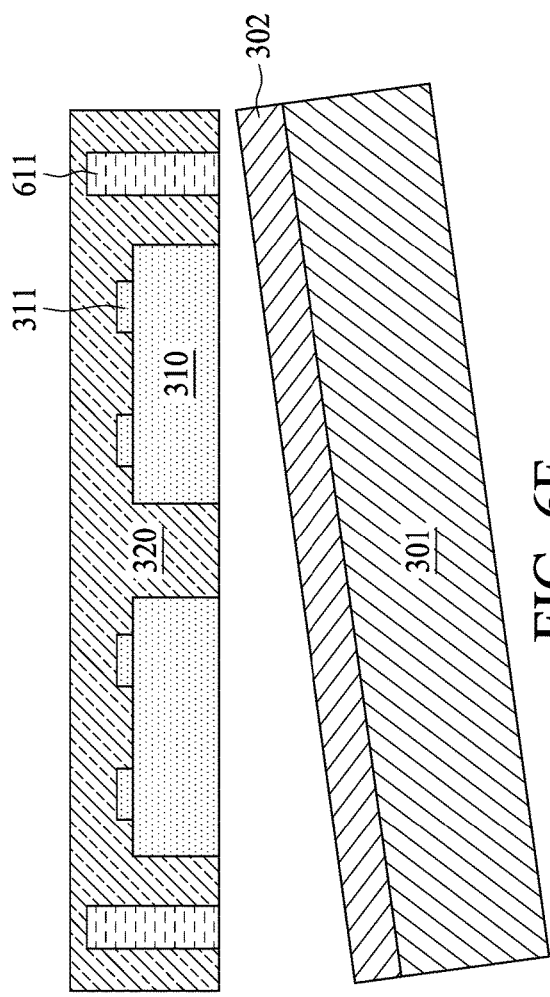
FIG. 6E
FIG. 6F

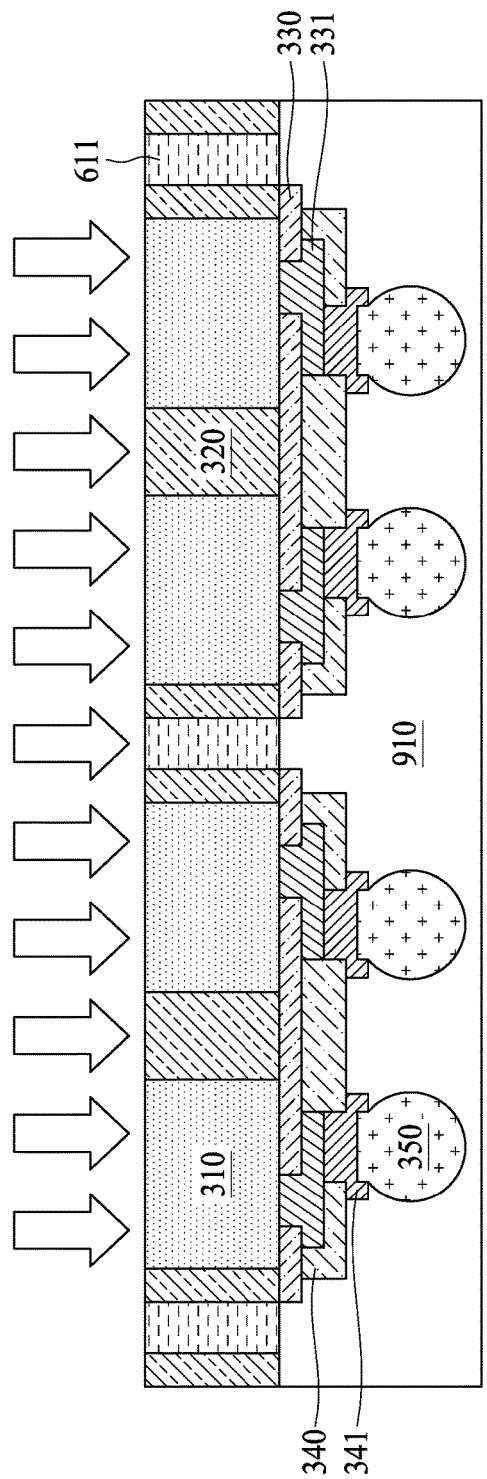
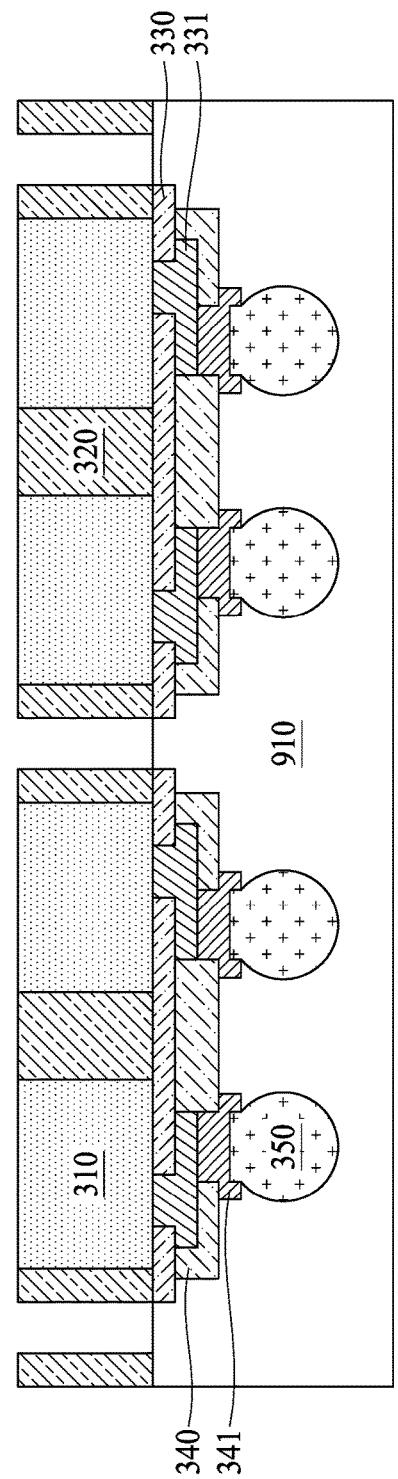
FIG. 9B
FIG. 9C

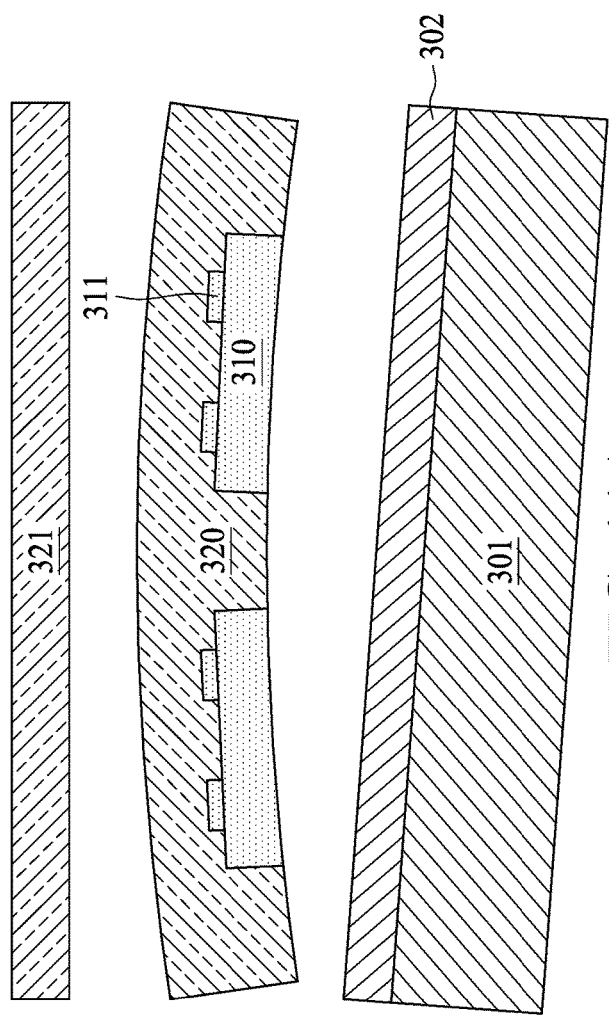
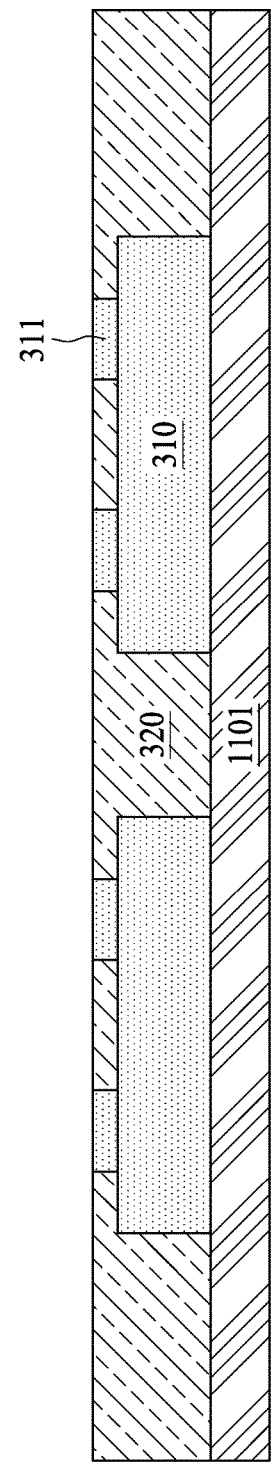
FIG. 11A
FIG. 11B

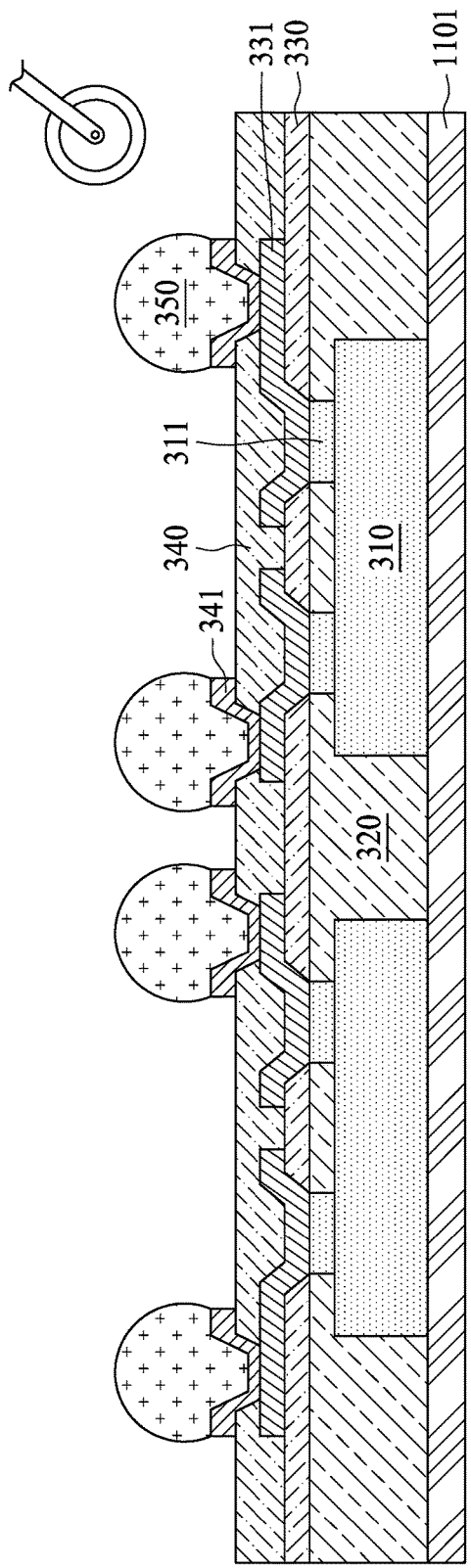
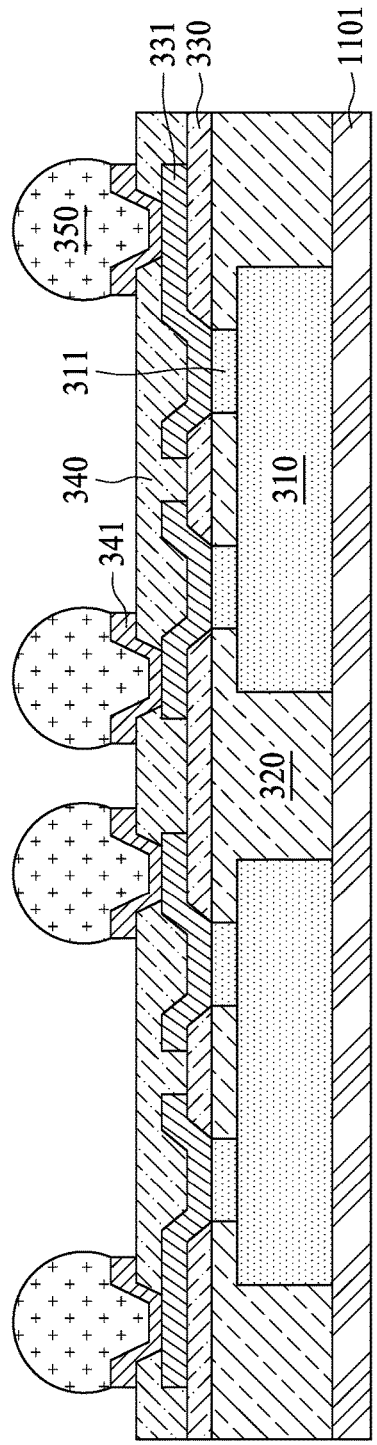
FIG. 11E
FIG. 11F

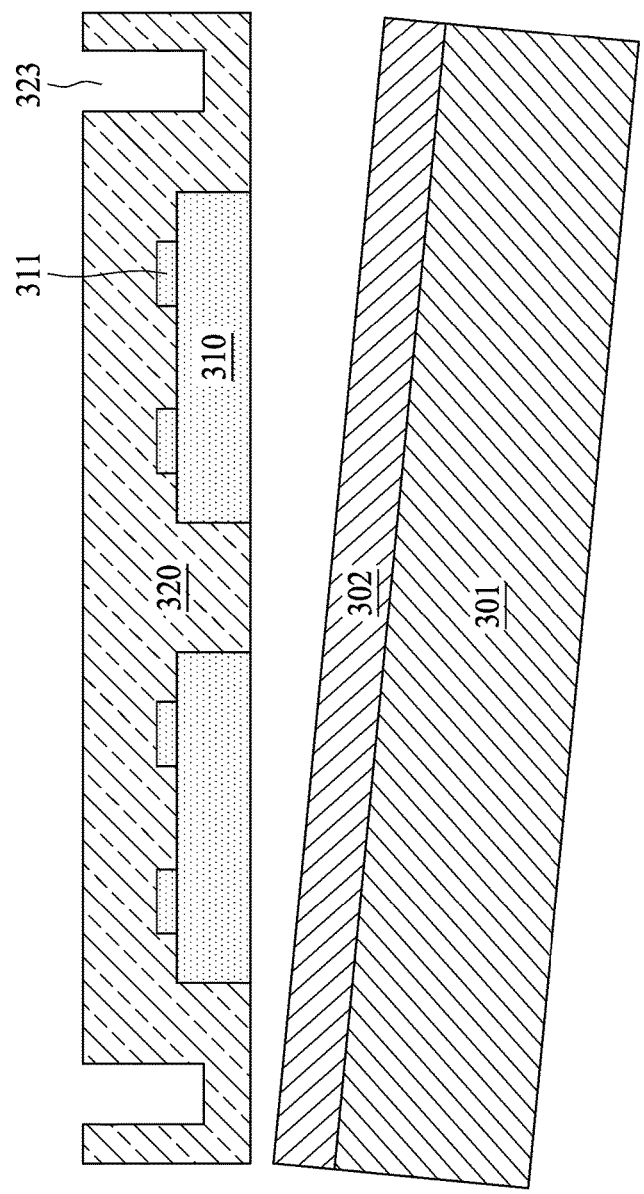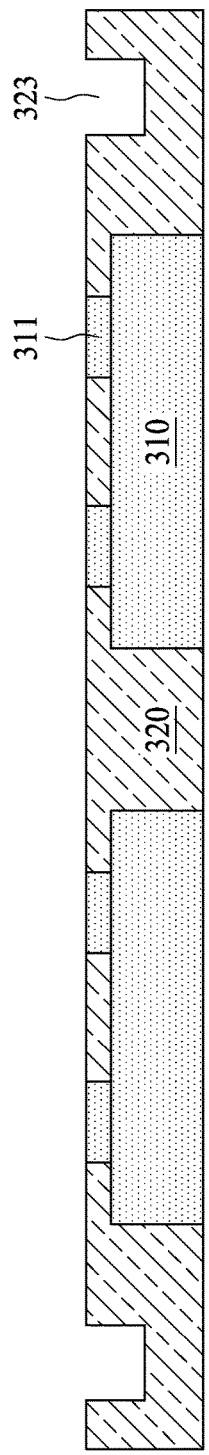
FIG. 12A
FIG. 12B

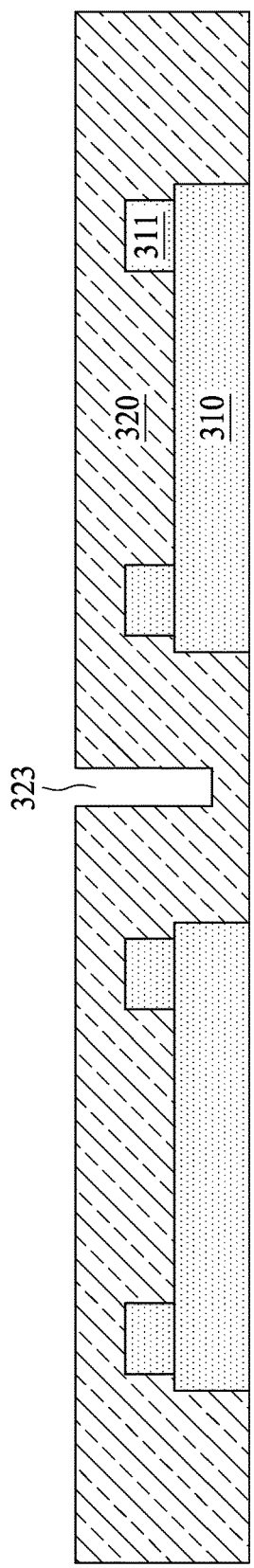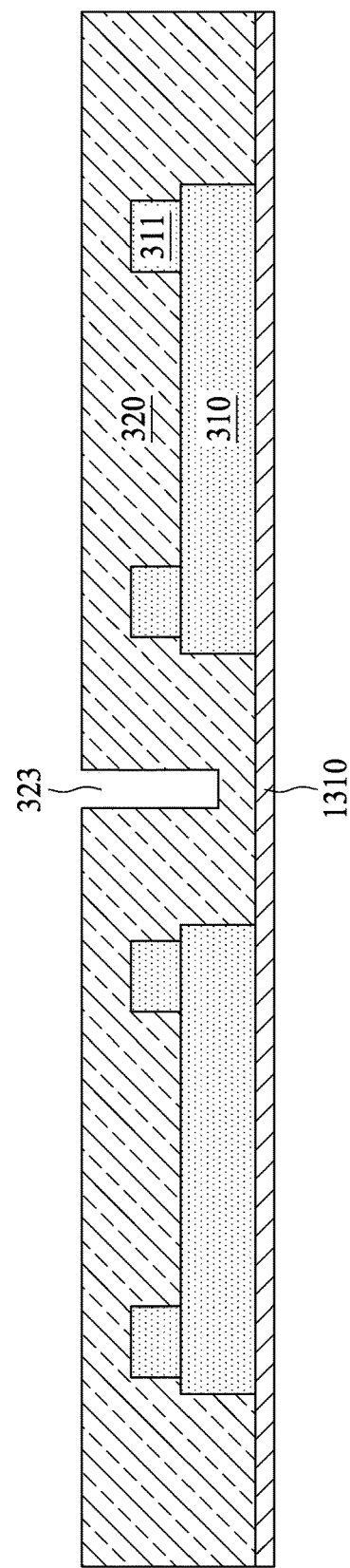

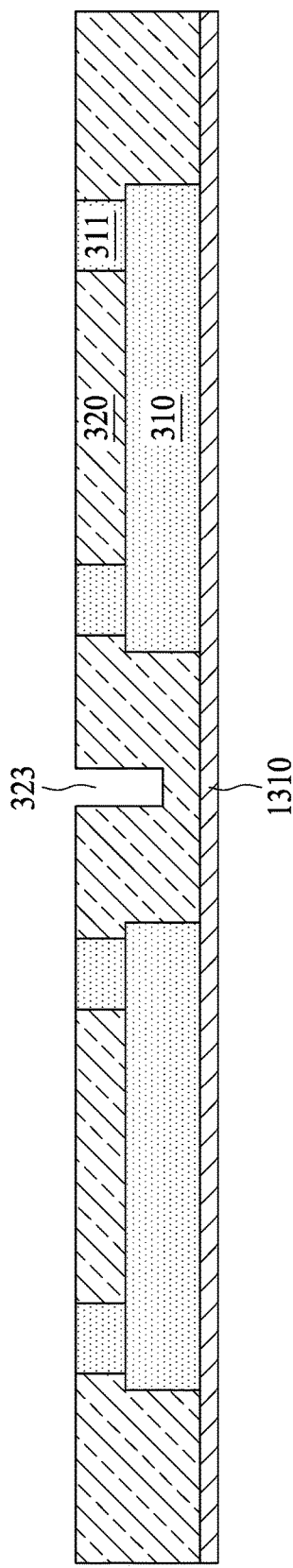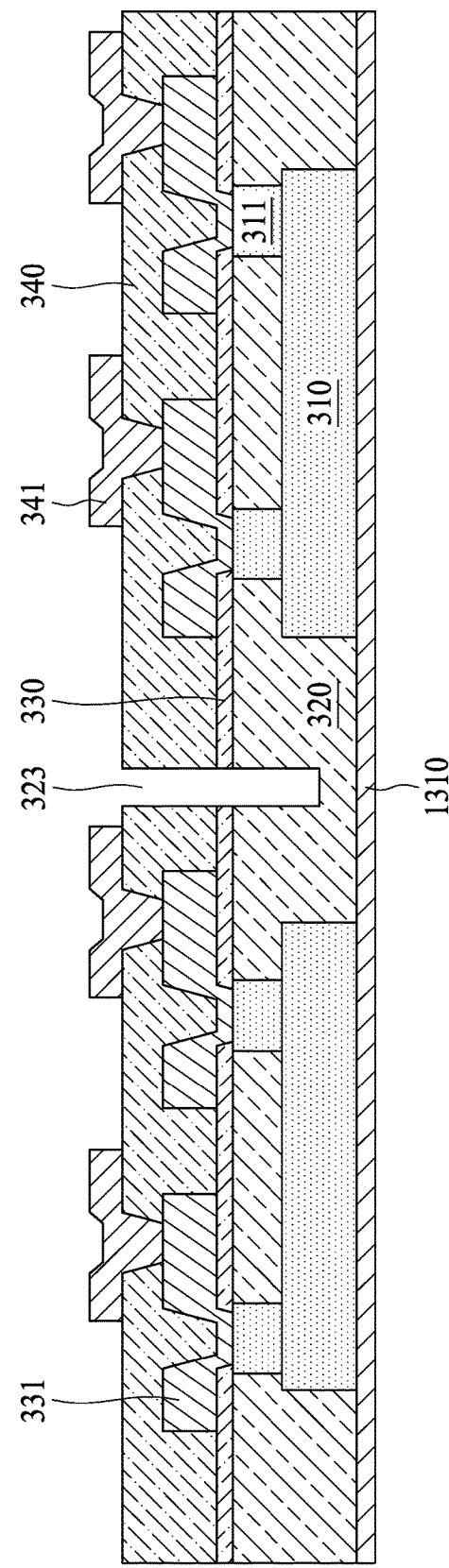

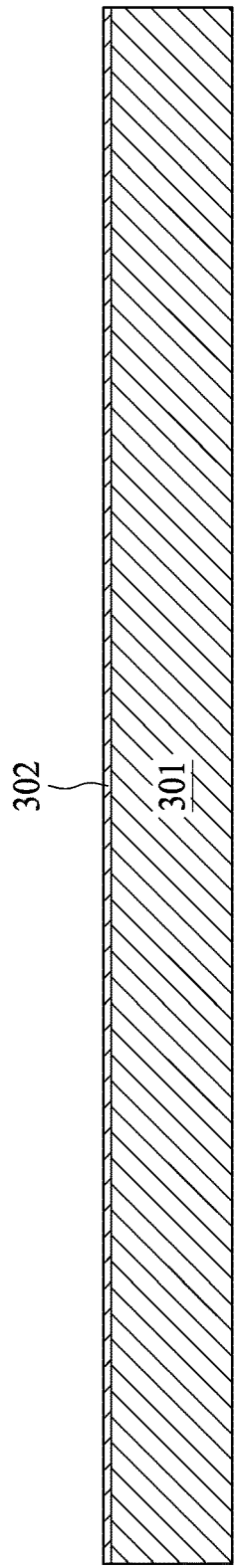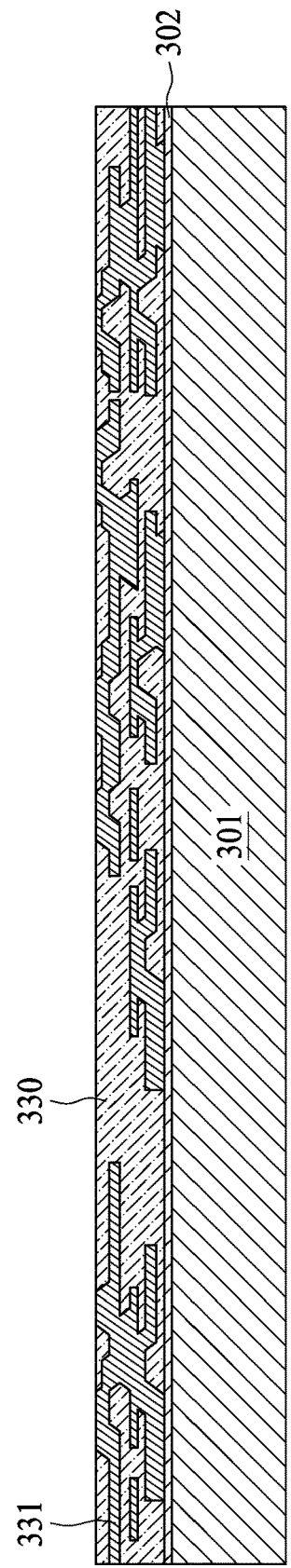

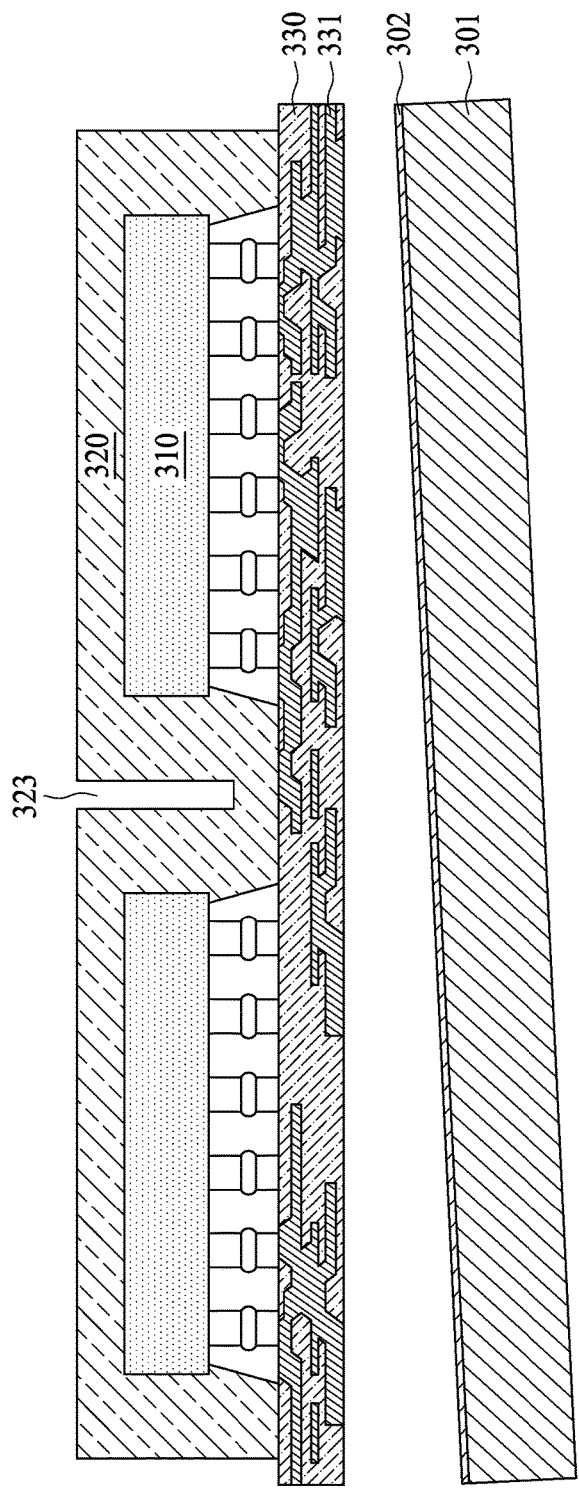
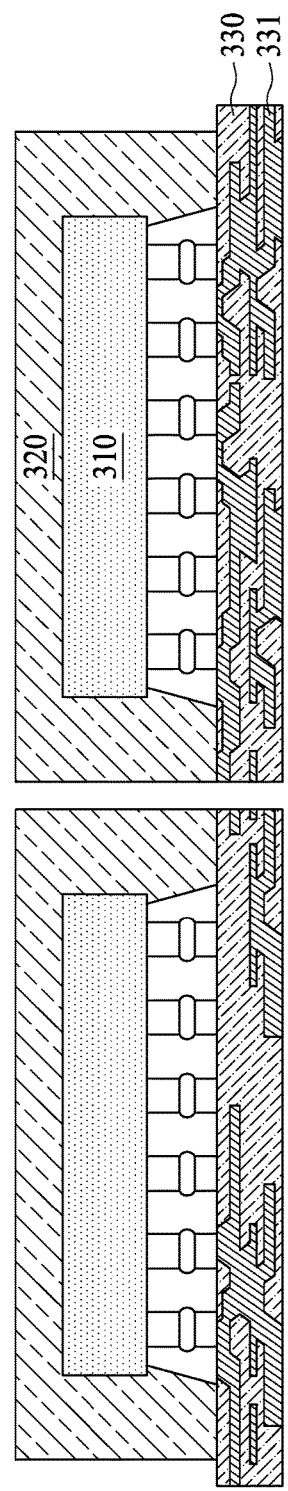
FIG. 14E
FIG. 14F

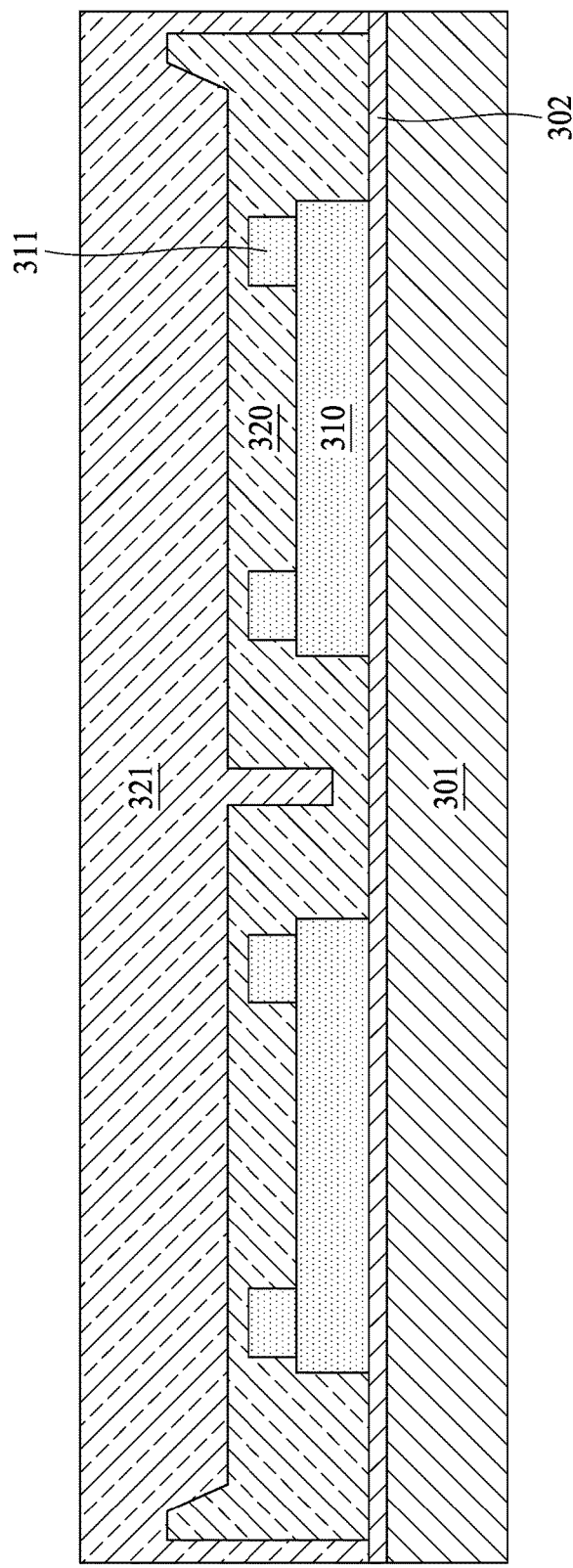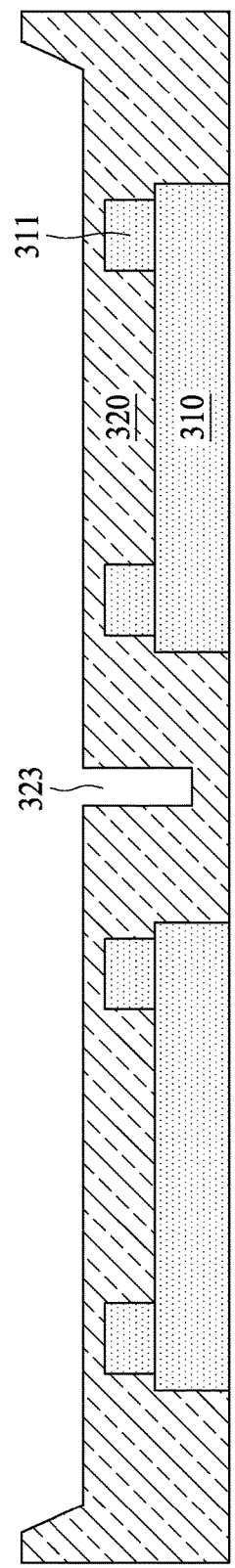
FIG. 17C
FIG. 17D

MOLDING FOR LARGE PANEL FAN-OUT PACKAGE

CROSS-REFERENCE TO RELATED APPLICATIONS

This application claims the benefit of and priority to U.S. Provisional Application No. 62/373,759, filed Aug. 11, 2016, U.S. Provisional Application No. 62/374,558, filed Aug. 12, 2016, and U.S. Provisional Application No. 62/382,064, filed Aug. 31, 2016, the contents of which are incorporated herein by reference in their entireties.

BACKGROUND

1. Technical Field

The present disclosure relates to wafer level packages, and to a semiconductor package including one or more semiconductor dies and a method of manufacturing the same.

2. Description of the Related Art

During manufacture of a large panel/wafer structure (e.g., a large panel/wafer fan-out structure), such as during post molding or de-bonding stages of the manufacture, warpage of the large panel/wafer may occur. In some cases, significant warpage may occur, which can decrease production yield and increase manufacturing time.

Furthermore, for wafer level packages, in some cases where singulation and separation of a large panel is performed by a panel saw or a laser, a large number of dies on a panel may result in a low production yield.

SUMMARY

The present disclosure relates to, among other things, wafer level packages including one or more semiconductor dies and a method of manufacturing the same. According to one aspect of the present disclosure, some embodiments provide for a method including providing a carrier having a predetermined area, disposing a semiconductor device on the predetermined area, and forming a sacrificial wall on a periphery of the predetermined area.

According to another aspect of the present disclosure, some embodiments provide for a semiconductor device package including a semiconductor device, an encapsulant covering the semiconductor device, the encapsulant having a first surface and a second surface adjacent to the first surface, and a redistribution layer electrically connected to the semiconductor device, wherein a contact angle of the first surface of the encapsulant is greater than a contact angle of the second surface of the encapsulant.

Embodiments of the present disclosure also include a semiconductor package incorporating a polymer structure or a molding compound structure that can provide for reducing or minimizing warpage of the package. Additionally, the polymer structure may provide for omitting a mechanical sawing process for separation (singulation) of individual package units from a multi-unit package. The polymer structure can be embedded into an encapsulant and can surround one or more semiconductor dies.

The techniques of the present disclosure are applicable to chip-first and chip-last manufacture, for example.

BRIEF DESCRIPTION OF THE DRAWINGS

FIG. 1 illustrates a top view of a panel during manufacture before separation/singulation in accordance with some embodiments of the present disclosure.

FIG. 2 shows a cross-sectional view of a semiconductor package according to some embodiments of the present disclosure.

FIG. 3A, FIG. 3B, FIG. 33, FIG. 3C, FIG. 3D, FIG. 3E, FIG. 3F, FIG. 3G, FIG. 3H, FIG. 3I, FIG. 3J, and FIG. 3K illustrate a manufacturing process of a semiconductor package according to some embodiments of the present disclosure.

FIG. 4A, FIG. 4B, FIG. 4C, and FIG. 4D illustrate another manufacturing process of a semiconductor package according to some embodiments of the present disclosure.

FIG. 5A, FIG. 5B, FIG. 5C, FIG. 5D, and FIG. 5E illustrate another manufacturing process of a semiconductor package according to some embodiments of the present disclosure.

FIG. 6A, FIG. 6B, FIG. 6C, FIG. 6D, FIG. 6E, FIG. 6F, and FIG. 6G illustrate another manufacturing process of a semiconductor package according to some embodiments of the present disclosure.

FIG. 9A, FIG. 9B, FIG. 9C, FIG. 9D, and FIG. 9E show cross-sectional views of a semiconductor package at various stages of an example manufacturing process according to some embodiments of the present disclosure.

FIG. 11A, FIG. 11B, FIG. 11C, FIG. 11D, FIG. 11E, and FIG. 11F illustrate another manufacturing process of a semiconductor package according to some embodiments of the present disclosure.

FIG. 12A, FIG. 12B, FIG. 12C, FIG. 12D, FIG. 12E, FIG. 12F, and FIG. 12G illustrate another manufacturing process of a semiconductor package according to some embodiments of the present disclosure.

FIG. 13A, FIG. 13B, FIG. 13C, FIG. 13D, FIG. 13E, FIG. 13F, FIG. 13G, FIG. 13H, and FIG. 13I illustrate another manufacturing process of a semiconductor package according to some embodiments of the present disclosure.

FIG. 14A, FIG. 14B, FIG. 14C, FIG. 14D, FIG. 14E, FIG. 14F, and FIG. 14G illustrate another manufacturing process of a semiconductor package according to some embodiments of the present disclosure.

FIG. 17A, FIG. 17B, FIG. 17C, FIG. 17D, FIG. 17E, and FIG. 17F illustrate some embodiments of a manufacturing process for fabricating a panel.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 3A:
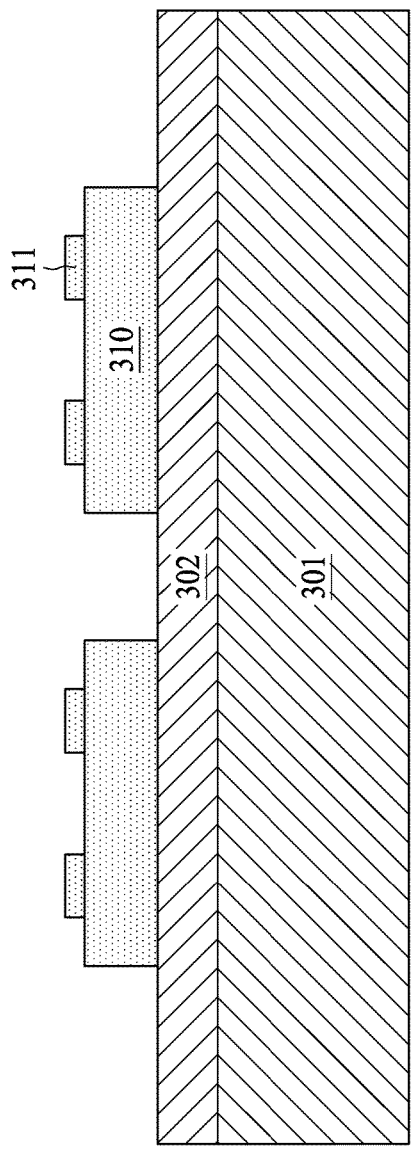

FIG. 1 illustrates in a top view some embodiments of a panel during manufacture before separation/singulation, in which a molding compound 110 is disposed on a carrier 120. In the depicted embodiments, a portion of the carrier 120 is visible around an outer periphery of the panel (see, e.g., the discussion with respect to FIG. 2C below). The molding compound 110 is subdivided into N×M portions by, for example, depressions or recesses (not shown in detail) in the molding compound 110. For purposes of discussion, FIG. 1 illustrates a molding compound 110 in which M=N=2, such that there are 2×2=4 portions in an array of approximately equal-sized portions, where each portion is approximately square. It is to be understood that within the scope of the present disclosure different portions may have different sizes, and may have shapes other than square. A surface area of the panel may be up to, for example, about 600 square millimeters (mm²), or more.

Apportioning a molding compound into subdivisions as described in the present disclosure can reduce material stress in subsequent stages of manufacture, thereby reducing warpage of a panel and warpage of individual packaged devices separated/singulated from the panel. Further, as will be seen from the description below, panel scribe lines may be omitted.

FIG. 2 shows a cross-sectional view of a semiconductor package according to some embodiments of the present disclosure. As shown in FIG. 2, the semiconductor package 200 includes one or more semiconductor dies or chips 210, a molding compound or an encapsulant 220 covering at least a portion of the one or more semiconductor dies 210 but exposing a metal or metal contact 211 of the one or more semiconductor dies 210, a first passivation layer 230 disposed on the molding compound 220, a first metal layer 231 electrically connected to the metal or metal contact 211, a second passivation layer 240 and a second metal layer 241 disposed on the first passivation layer 230 and on the first metal layer 231, and a solder ball 250 disposed on the second metal layer 241.

The semiconductor package 200 shown in FIG. 2 can be fabricated by methods of manufacture according to some embodiments of the present disclosure, and will be further described in the following description.

FIG. 3A through FIG. 3K illustrate a manufacturing process of a semiconductor package according to some embodiments of the present disclosure. Although some drawings of FIG. 3A through FIG. 3K show manufacture of a single semiconductor device, the semiconductor device can be manufactured as part of a panel of semiconductor devices. Subsequent drawings may show singulation of semiconductor devices of the panel of semiconductor devices.

As shown in FIG. 3A, a release film 302 may be deposited, laminated, or coated onto a carrier 301. Any appropriate technique may be used to dispose the release film 302 on the carrier 301. For example, the release film 302 may be thermally laminated onto the carrier 301. The carrier 301 may be any suitable carrier, such as a carrier including a metal or a glass, or a semiconductor substrate.

Figure 3B:
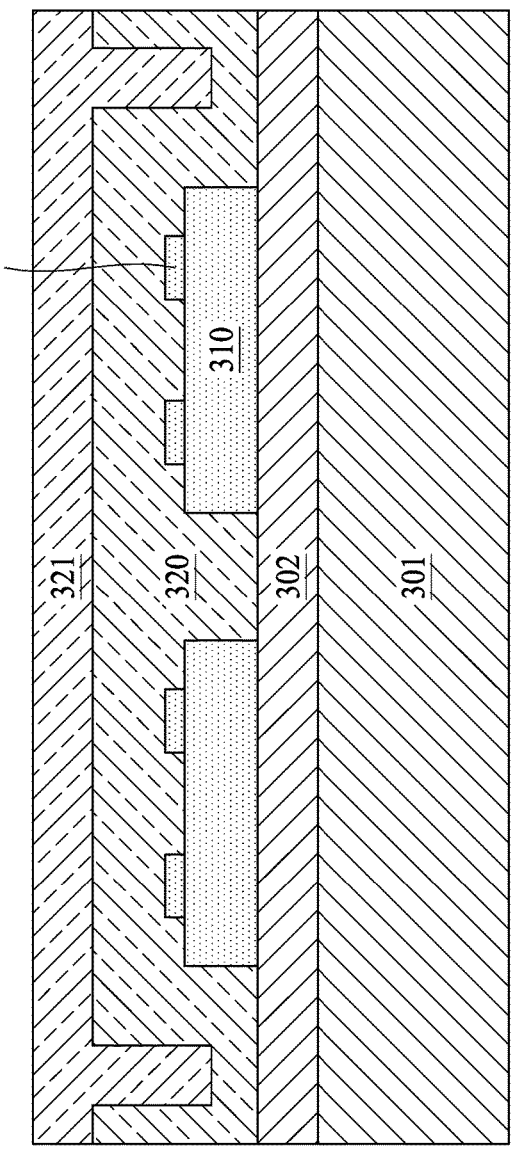

Next, as shown in FIG. 3B, semiconductor dies 310 (which, in the depicted example, are chips) may be disposed with active surfaces face-up onto the release film 302. Metal contacts 311 may be attached to, or may be a part of, each semiconductor die 310. A molding tray 321 is positioned over the release film 302 and above the semiconductor dies 310, and a molding compound 320 is applied under the molding tray 321, such that the molding compound 320 encases each semiconductor die 310.

As depicted in FIG. 33, protrusions (which may be referred to herein as "legs") may extend from a base portion of the molding tray 321, which may result in the molding compound 320 defining depressions 323 (e.g. recesses) after application of the molding compound 320. The legs may extend at an angle from about 45 degrees to about 90 degrees, relative to a plane of the base portion.

As shown in FIG. 3C, the molding tray 321 is removed and the carrier 301 along with the release film 302 are removed. After removal of the molding tray 321, depressions 323 at the periphery of subdivisions of the molding compound 320 are exposed.

Figure 3D:
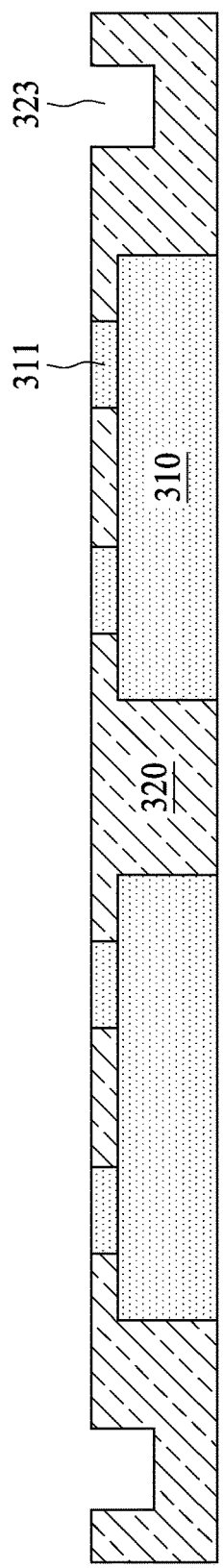

As shown in FIG. 3D, a portion of the molding compound 320 is then removed, such as by grinding or etching, to expose the metal contacts 311 of each semiconductor die 310.

Figure 3E:
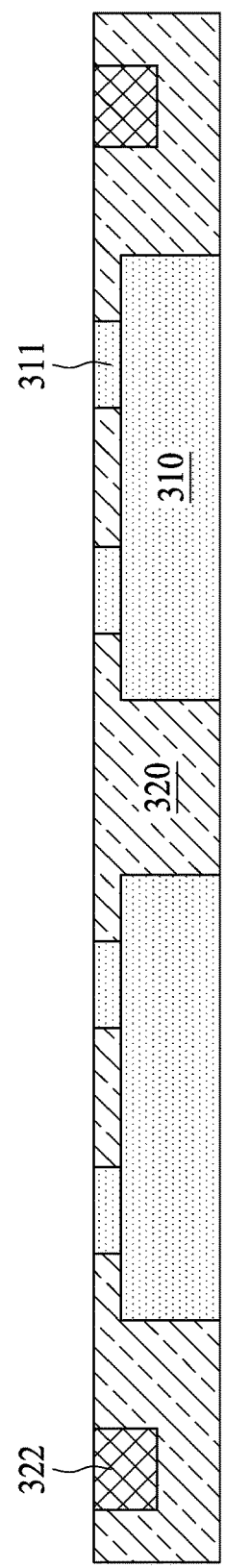

Afterwards, as depicted in FIG. 3E, the depressions 323 are filled at least in part with a thermal release film or an ultraviolet (UV) light release film 322, which are respectively sensitive to exposure to temperature or UV light, and decompose upon such exposure to reduce or eliminate a cohesion property of the release film 322.

Figure 3F:
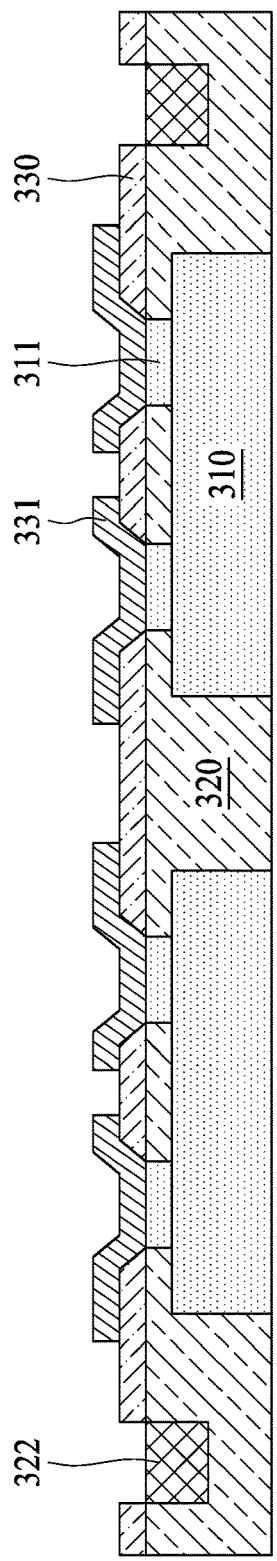

Subsequently, as shown in FIG. 3F, a first passivation layer 330 is formed or disposed on the molding compound 320. The first passivation layer 330 includes passivation material and exposes the metal contacts 311 of the semiconductor dies 310. At least a portion of a first metal layer 331 is disposed or formed on the metal contacts 311. The first passivation layer 330 may surround at least a portion of the first metal layer 331 (e.g. a portion of the first metal layer 331 that is in contact with the metal contacts 311). The first passivation layer 330 may include, for example, a polyimide or benzocyclobutene, and the first metal layer 331 may include, for example, a metal or a metal alloy or another combination of two or more metals. The first passivation layer 330 and the first metal layer 331 constitute at least a portion of a first redistribution layer.

Figure 3G:
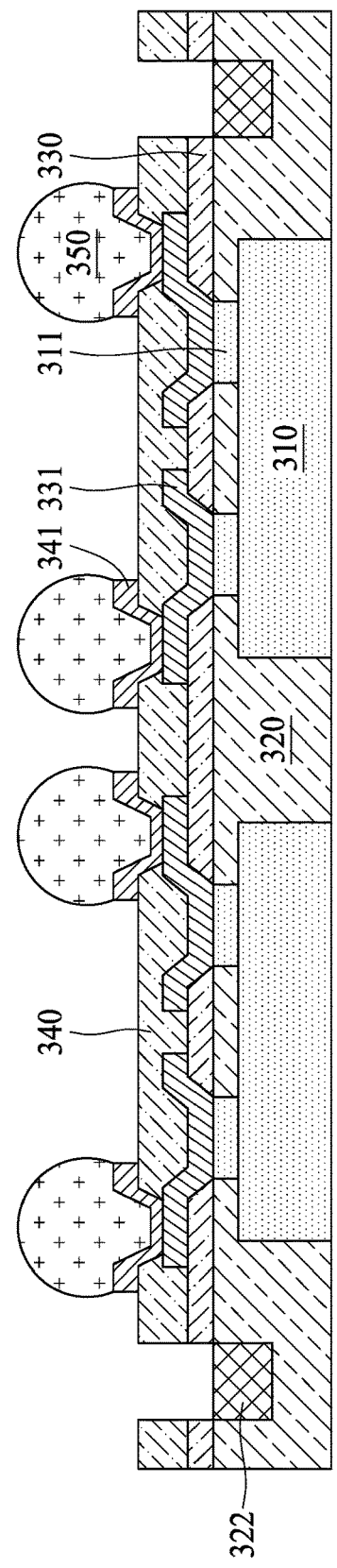

Next, as illustrated in FIG. 3G, a second passivation layer 340 is formed or disposed above the first redistribution layer including the first passivation layer 330 and the first metal layer 331. The passivation layers 330 and 340 may define vias or spaces for other interconnects. The passivation layers 330 and 340 may include, for example, a polyimide or benzocyclobutene. A second metal layer 341 is formed or disposed on the first metal layer 331 and on the second passivation layer 340, and may contact the first metal layer 331 via a space or hole defined by the second passivation layer 340. The second passivation layer 340 and the second metal layer 341 constitute at least a portion of a second redistribution layer. The first and second redistribution layers may include conductive vias or other interconnects (e.g. each passivation layer of the respective redistribution layers can define spaces or holes that traverse the passivation layers, and the corresponding metal layers fill at least a portion of those spaces or holes). This can provide for electrical and/or physical connections between the metal layers 331 and 341, between at least one of the metal layers 331 and 341 and at least one of the metal contacts 311, and/or between at least one of the metal layers 331 and 341 and pads disposed on a surface of one of the first and second redistribution layers. One or more of the conductive vias may be formed concurrently with an under bump metallization (UBM) layer, such that the UBM layer and the one or more conductive vias are integrally formed. The second metal layer 341 may include a UBM layer such that the UBM layer is in electrical contact with the metal contacts 311 of the semiconductor dies 310. Solder balls or connectors 350 are disposed on the UBM layer to electrically connect to the redistribution layers.

Figure 3H:
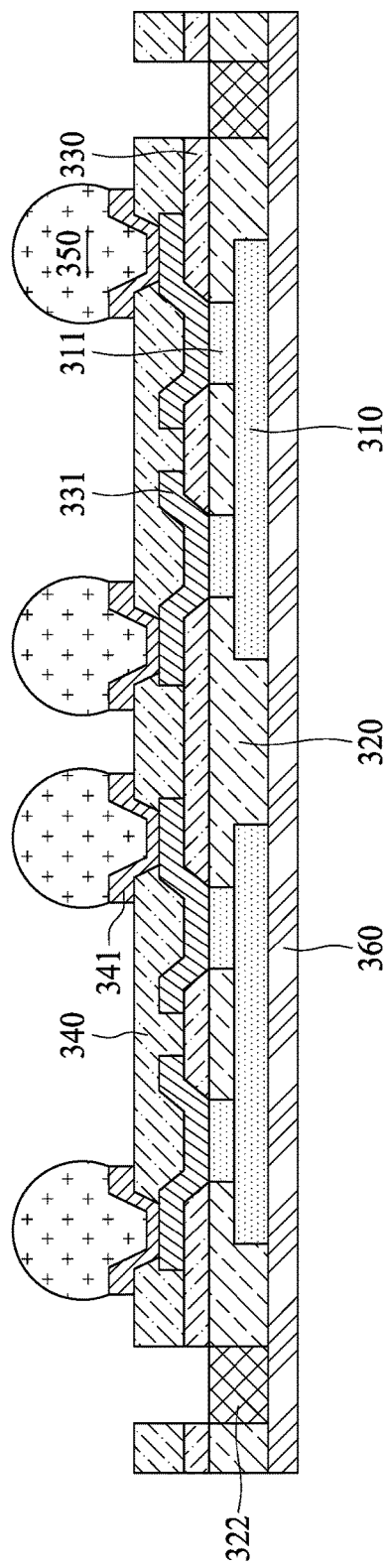

As depicted in FIG. 3H, the backside of the molding compound 320 is grinded to expose the backside of the release film 322, and then the semiconductor structure is disposed on an adhesive layer 360.

Figure 3I:
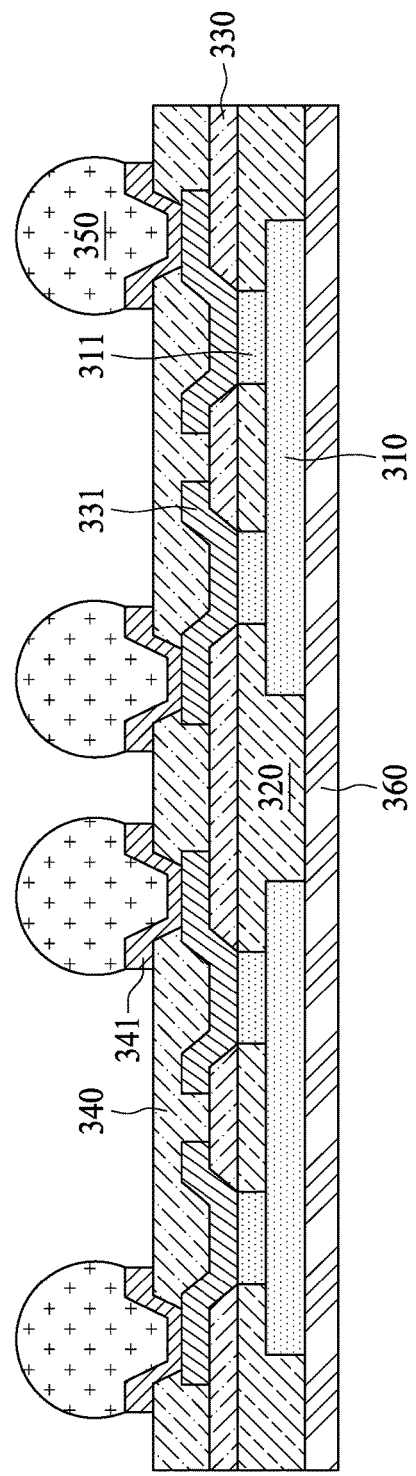
Figure 3J:
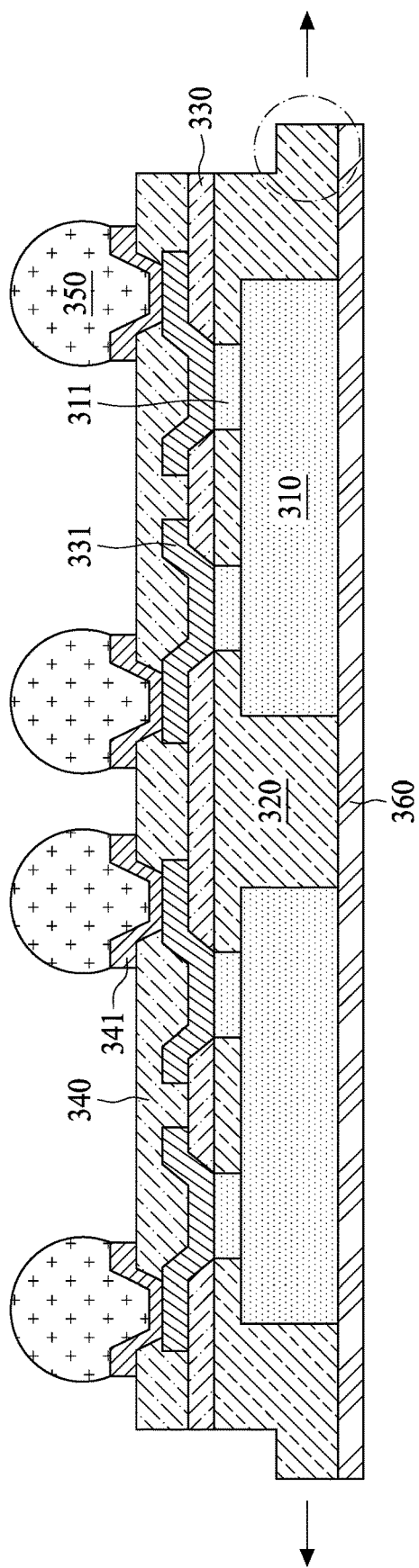
Figure 3K:
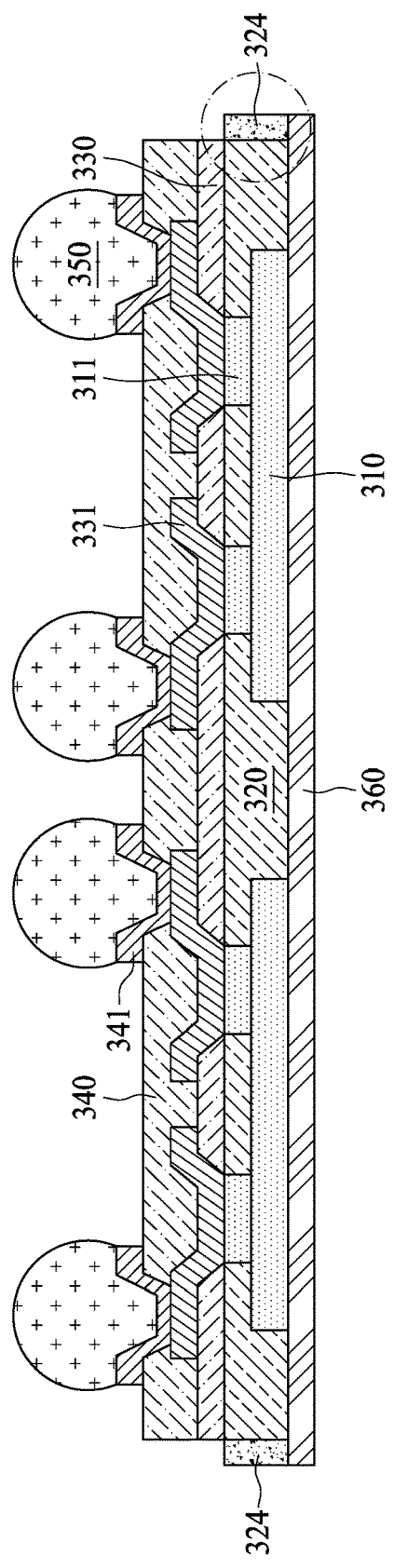

Next, FIG. 3I through FIG. 3K illustrate several approaches to separating the panel that includes multiple semiconductor structures (such as those semiconductor structures described above) into individual semiconductor packages.

As shown in FIG. 3I, thermal or UV energy is radiated on the release film 322, which decomposes the release film 322 such that cohesion provided by the release film 322 between portions of the panel is weakened or destroyed and individual components may be readily separated from the panel. Since a sawing process for separation may thus be omitted, this approach can increase the yield rate/units per hour (UPH) of a separating process. Then the individual semiconductor packages can be further removed or separated from the adhesive layer 360.

As depicted in FIG. 3J, a force for expanding the semiconductor packages is applied in a horizontal direction (e.g. a direction orthogonal to a lateral surface of the molding compound 320, as shown by arrows in FIG. 3J). This may include applying a force that expands a lateral surface of the molding compound 320 outward. Since the rigidity of the panel at the depression 323 may be weak, the panel can be separated into individual semiconductor packages by performing the above-described expansion of the semiconductor packages on the adhesive layer 360, and/or by applying the force described above (e.g. to pull semiconductor packages of the panel apart). Thus, an L shape or a step-like shape or structure defined by the molding compound 320 (circled in dotted lines in FIG. 3J) is formed. A lateral surface of the step-like shape of the molding compound 320 may include two portions that are adjacent to each other: a first upper recessed portion and a second lower protruding portion. The second lower protruding portion may be less rough than is the first upper recessed portion. Since a sawing process for separation may thus be omitted, this approach can increase the yield rate/UPH of a separating process. Subsequently, the individual semiconductor packages can be further removed or separated from the adhesive layer 360.

The semiconductor structure shown in FIG. 3K is generated by a manufacturing process similar to that shown in FIG. 3A through FIG. 3H, except that instead of performing the stage shown in FIG. 3E, where the depressions 323 are filled at least in part with the thermal release film or the UV light release film 322, the depressions 323 are filled at least in part with a protection film 324 (e.g. an insulating layer). That is to say, other than the materials filled in the depressions 323, the semiconductor structure shown in FIG. 3K is substantially the same as or similar to that shown in FIG. 3H, prior to separation of the semiconductor structures of the panel. A top surface of the protection film 324 may not be coplanar with (e.g. may be recessed from) a surface of the first redistribution layer (e.g. a top surface of the first metal layer 330. The protection film 324 may cover a lateral surface of the molding compound 320. The lateral surface of the molding compound 320 may have a roughness less than a roughness of an adjacent surface (e.g. a top surface or a bottom surface) of the molding compound 320, and may have a contact angle with respect to water greater than that of the adjacent surface. The backside of the molding compound 320 is grinded to expose the backside of the protection film 324. A panel saw is used to cut the panel at the protection film 324 of the molding compound 320. The protection film 324 may be more readily sawed through than the molding compound 320 (e.g. the protection film 324 may have a smaller rigidity or strength modulus than that of the molding compound 320), and thus this approach can increase the yield rate/UPH of a sawing/separating process. Subsequently, the individual semiconductor packages can be further removed or separated from the adhesive layer 360.

FIG. 4A through FIG. 4D illustrate another manufacturing process of a semiconductor package according to some embodiments of the present disclosure. Although some drawings of FIG. 4A through FIG. 4D show manufacture of a single semiconductor device, the semiconductor device can be manufactured as part of a panel of semiconductor devices. Subsequent drawings may show singulation of semiconductor devices of the panel of semiconductor devices.

Prior to the stage shown in FIG. 4A, similar to the stages shown in FIG. 3A and FIG. 3B, the release film 302 is deposited onto the carrier 301. Semiconductor dies 310 are disposed with active surfaces face-up onto the release film 302. Metal contacts 311 are attached to, or are part of, each semiconductor die 310. A molding tray 321 is positioned over the release film 302 above the semiconductor dies 310, and a molding compound 320 is applied under the molding tray 321, such that the molding compound 320 encases each semiconductor die 310. Then the molding tray 321 is removed.

As shown in FIG. 4A, similar to the stage shown in FIG. 3F, a first redistribution layer including a first passivation layer 330 and a first metal layer 331 is disposed on the molding compound 320. The first passivation layer 330 exposes the metal contacts 311 of the semiconductor dies 310, and at least a portion of the first metal layer 331 is surrounded by the first passivation layer 330.

Next, as illustrated in FIG. 4B, similar to the stage shown in FIG. 3G, a second redistribution layer including a second passivation layer 340 and a second metal layer 341 is formed or disposed above the first redistribution layer. The second metal layer 341 may include a UBM layer such that the UBM layer is in electrical contact with the metal contacts 311 of the semiconductor dies 310.

Figure 4C:
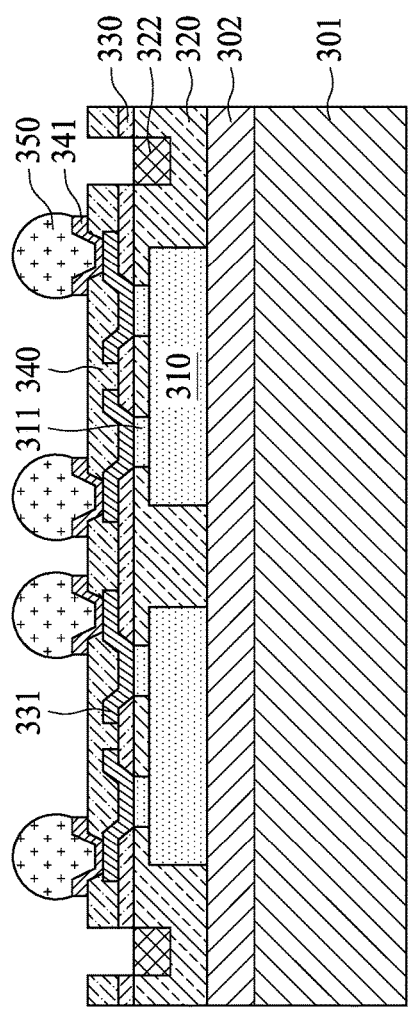

As depicted in FIG. 4C, the solder balls 350 are disposed on the UBM layer to electrically connect to the first and second redistribution layers.

Figure 4D:
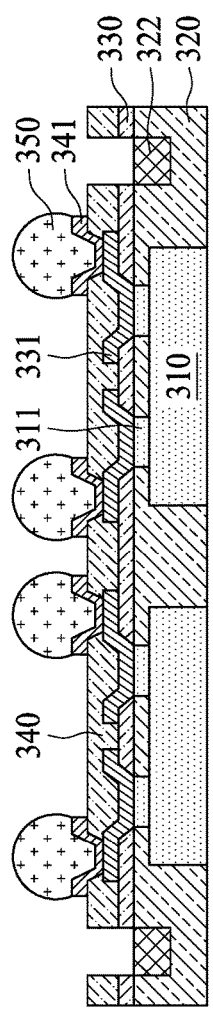

As shown in FIG. 4D, the carrier 301 along with the release film 302 are removed.

Similar to the stage shown in FIG. 3H, the adhesive layer 360 is formed or applied on the backside of the semiconductor dies 310. Thus, a panel structure before separation, similar to the structure shown in FIG. 3H is formed. Afterwards, the panel structure can be separated using the approaches shown in FIG. 3I through FIG. 3K to form separate semiconductor packages.

FIG. 5A through FIG. 5E illustrate another manufacturing process of a semiconductor package according to some embodiments of the present disclosure. Although some drawings of FIG. 5A through FIG. 5E show manufacture of a single semiconductor device, the semiconductor device can be manufactured as part of a panel of semiconductor devices. Subsequent drawings may show singulation of semiconductor devices of the panel of semiconductor devices.

Prior to the stage shown in FIG. 5A, similar to the stages shown in FIG. 3A through FIG. 3C, a release film 302 is deposited onto the carrier 301. Semiconductor dies 310 are disposed with active surfaces face-up onto the release film 302. Metal contacts 311 are attached to, or are part of, each semiconductor die 310. A molding tray 321 is positioned over the release film 302 above the semiconductor dies 310, and a molding compound 320 is applied under the molding tray 321, such that the molding compound 320 encases each semiconductor die 310. The molding tray 321, the carrier 301 and the release film 302 are removed, exposing depression gaps 323 defined by the molding compound 320.

As shown in FIG. 5A, a backside film 501 is formed or laminated on the backside of the semiconductor dies 310. The backside film 501 includes a compound dry film.

As depicted in FIG. 5B, the depressions 323 are filled at least in part with the thermal release film or the UV light release film 322.

As shown FIG. 5C, similar to the stage shown in FIG. 3F, the first redistribution layer including the first passivation layer 330 and the first metal layer 331 is disposed on the molding compound 320. The first passivation layer 330 exposes the metal contacts 311 of the semiconductor dies 310, and at least a portion of the first metal layer 331 is surrounded by the first passivation layer 330.

Next, as illustrated in FIG. 5D, similar to the stage shown in FIG. 3G, the second redistribution layer is formed or disposed above the first redistribution layer. The second redistribution layer includes the second passivation layer 340 and the second metal layer 341. The second metal layer 341 may include a UBM layer such that the UBM layer is in electrical contact with the metal contacts 311 of the semiconductor dies 310.

Figure 5E:
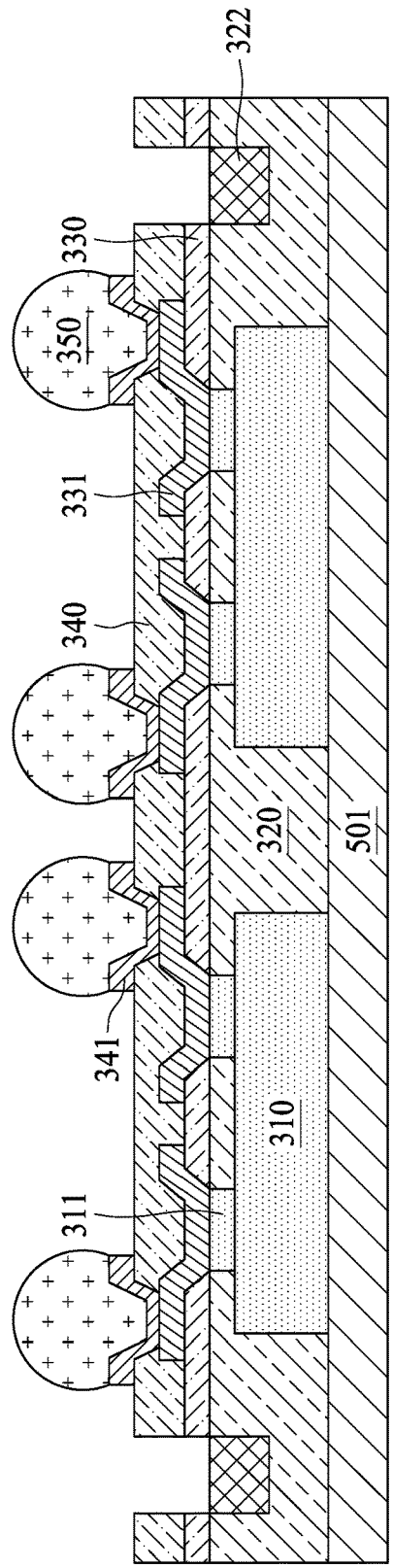

As depicted in FIG. 5E, the solder balls 350 are disposed on the UBM layer to electrically connect to the redistribution layers.

Similar to the stage shown in FIG. 3H, the adhesive layer 360 is formed on the backside film 501. Afterwards, the panel structure can be separated using the approaches shown in FIG. 3I through FIG. 3K to form the separate semiconductor packages.

FIG. 6A through FIG. 6G illustrate another manufacturing process of a semiconductor package according to some embodiments of the present disclosure.

As shown in FIG. 6A, a layer of a polymer material (or combination of polymer materials) 610 is disposed over a release film 302 and a carrier 301. In one or more embodiments, the layer of polymer material 610 includes an epoxy. The release film 302 may include an adhesive disposed over the carrier 301 to adhere the layer of polymer material 610 to the carrier 301.

As shown in FIG. 6B, a mask 620 is disposed over the layer of polymer material 610.

As shown in FIG. 6C, the layer of polymer material 610 is patterned to form a polymer structure 611. The polymer structure 611 may include or may be, for example, one or more sacrificial walls. The layer of polymer material 610 can be patterned to form the polymer structure 611 using, for example, a photo-chemical etching technique, such as applying a photoresist over the polymer material, exposing the photoresist through the mask, developing the photoresist, and etching the photoresist to remove the polymer material around the polymer structure 611. In one or more embodiments, the polymer structure 611 can be similar to that shown in FIG. 6E, where the polymer structure 611 forms a matrix of multiple walled cavities. In one or more embodiments, the polymer structure 611 may include multiple parallel walls along a single direction, resulting in parallel regions separated by the parallel walls. A total number of walls or walled cavities can be one or more, and the total number can be selected based, at least in part, on an amount of differential stress to be provided by the polymer structure 611 being sufficient to substantially counteract warping.

As shown in FIG. 6D, one or more semiconductor dies 310 are disposed (e.g. disposed with active surfaces face-up) over the release film 302 on the carrier 301 and between portions of the polymer structure 611. Metal contacts 311 are attached to, or are part of, each semiconductor die 310.

As shown in FIG. 6E, a molding compound 320 is disposed over the carrier 301, the semiconductor dies 310 and the polymer structure 611. The molding compound 320 covers top and lateral surfaces of the semiconductor dies 310 and the polymer structure 611.

As shown in FIG. 6F, the carrier 301 and release film 302 are removed.

A stress differential within different portions of the semiconductor package may cause warpage. The polymer structure 611 can help to reduce or minimize the warpage, especially during removal of the carrier 301. In one or more embodiments, the polymer structure 611 increases a stiffness of the semiconductor package, thereby countering stress differential and reducing an extent of warpage.

Figure 6G:
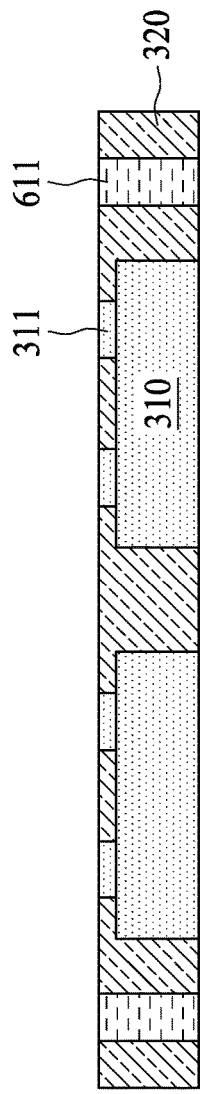

As shown in FIG. 6G, the semiconductor package is thinned, such as by grinding, so that respective top and bottom surfaces of the semiconductor dies 310, the molding compound 320, and the polymer structure 611 are substantially coplanar. In one or more embodiments, one or both of the top and the bottom surfaces of the semiconductor dies 310 can include die bond pads, which can provide for electrical connections to circuitry within the semiconductor dies 310. Exposing the top and/or the bottom surfaces of the semiconductor dies 310 provides for external electrical connections to be made to the die bond pads.

Figure 7:
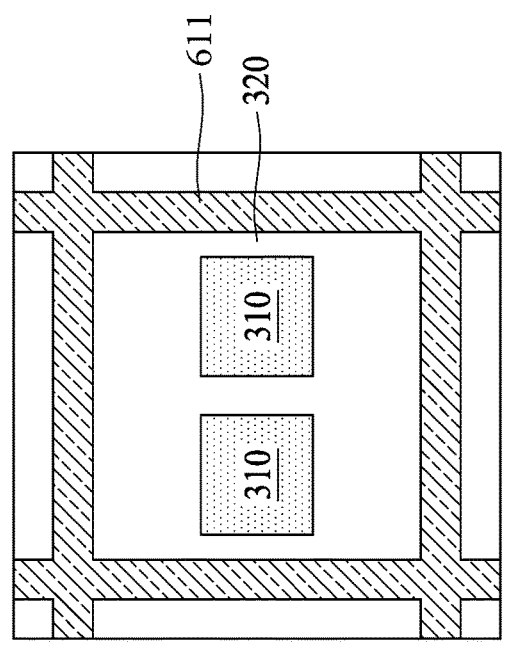
FIG. 7 depicts a top view of some embodiments of a semiconductor package after thinning.

FIG. 7 depicts a top view of a semiconductor package after thinning (e.g., after the stage shown in FIG. 6G). Semiconductor dies 310 are located within an area (e.g. a predetermined area) that is enclosed by a polymer structure 611 that can include multiple walls (e.g. sacrificial walls), and top surfaces of the semiconductor dies 310 and the polymer structure 611 are exposed. Lateral surfaces of the semiconductor dies 310 and the polymer structure 611 are covered by the molding compound 320. While FIG. 7 illustrates a single area enclosed by the polymer structure 611, the package can include multiple areas enclosed by the polymer structure 611, where each area can include one or more semiconductor dies 310.

Figure 8:
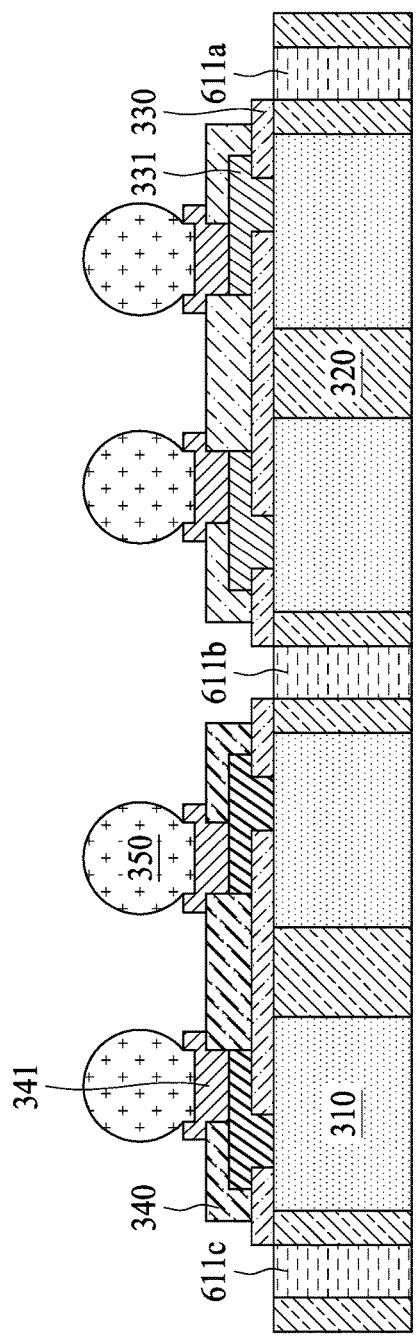
FIG. 8 depicts a cross-sectional view of a semiconductor package according to some embodiments of the present disclosure.

FIG. 8 depicts a cross-sectional view of a semiconductor package according to some embodiments of the present disclosure. The semiconductor package includes two individual package units, each including two semiconductor dies 310. A polymer structure 611 includes walls 611a and 611c near the outside of the semiconductor package, and a wall 611b is disposed between the individual package units.

Also illustrated in FIG. 8 is a first passivation layer 330, a first metal layer 331, a second passivation layer 340, a second metal layer 341, and solder balls 350 disposed over the molding compound 320 and the semiconductor dies 310. The solder balls 350 are electrically connected to pads of the semiconductor dies 310. The semiconductor package shown in FIG. 8 may be fabricated by the stages of manufacture illustrated in FIG. 6A through FIG. 6G, followed by forming or disposing the first passivation layer 330, the first metal layer 331, the second passivation layer 340, the second metal layer 341 and the solder balls 350 over the molding compound 320 and the semiconductor dies 310.

FIG. 9A through FIG. 9E show cross-sectional views of a semiconductor package at various stages of an example manufacturing process according to some embodiments of the present disclosure. Although some drawings of FIG. 9A through FIG. 9E show manufacture of a single semiconductor device, the semiconductor device can be manufactured as part of a panel of semiconductor devices. Subsequent drawings may show singulation of semiconductor devices of the panel of semiconductor devices.

Figure 9A:
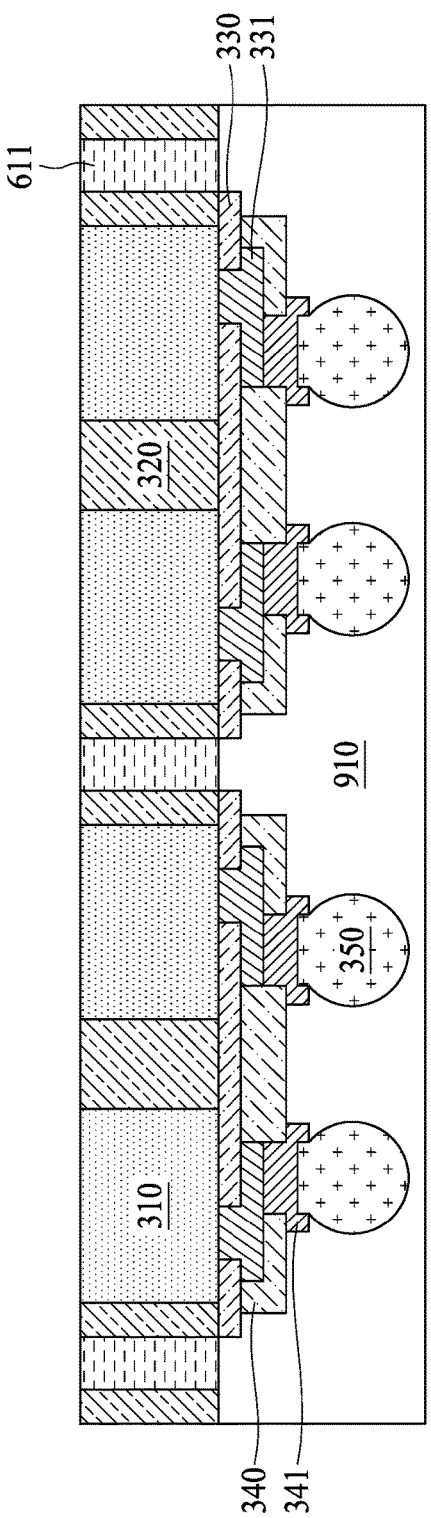

As shown in FIG. 9A, a semiconductor package such as the semiconductor package illustrated in FIG. 8 is provided. An adhesive tape 910 is disposed over the semiconductor package. The adhesive tape 910 covers the solder balls 350, the second metal layer 341, the second passivation layer 340, the first metal layer 331, the first passivation layer 330, the molding compound 320, and the polymer structure 611.

As shown in FIG. 9B, a chemical reaction is used to remove the polymer structure 611. The chemical reaction can involve exposing the semiconductor package to a dissolving agent that can dissolve the polymer material used to form the polymer structure 611 without affecting, or minimally affecting, other components such as the semiconductor dies 310 or the molding compound 320. In one or more embodiments, a photo-chemical technique can be used to remove the polymer structure 611.

As shown in FIG. 9C, the semiconductor package after removal of the polymer structure 611 is illustrated. The panel is separated into individual semiconductor packages by removing the polymer structure 611. Since a sawing process for separation may thus be omitted, this approach can increase the yield rate/UPH of a separating process.

Figure 9D:
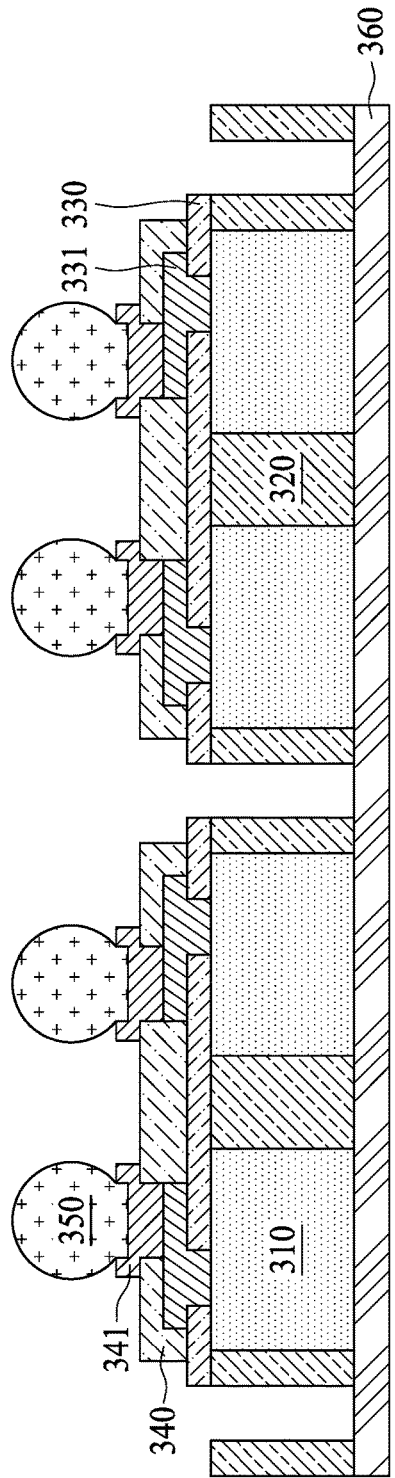

As shown in FIG. 9D, an adhesive layer 360 is disposed over a surface of the semiconductor package opposite to a surface at which the adhesive tape 910 is disposed and at which the solder balls 350 are disposed. Thereafter, the adhesive tape 910 is removed, exposing the solder balls 350, the second metal layer 341, the second passivation layer 340, the first metal layer 331, and the first passivation layer 330, along with side surfaces of the molding compound 320.

Figure 9E:
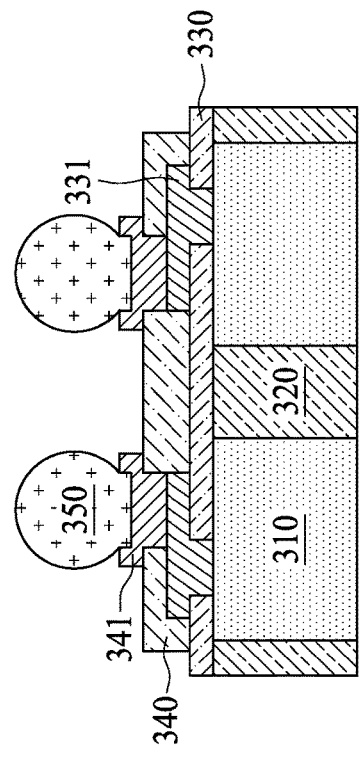

As shown in FIG. 9E, the adhesive layer 360 is removed, leaving individual package units. FIG. 9E illustrates a single individual package unit after separation. Accordingly, separation of the individual package units may be performed such that sawing is omitted. A degree of roughness of lateral surfaces of the molding compound 320 of the fabricated semiconductor package may thus be less than a corresponding degree of roughness that would have resulted if a sawing process had been used for singulation.

Further, sawing can involve implementing a large separation between adjacent individual package units, to avoid damaging the semiconductor dies during sawing. By using one or more polymer structures as discussed with respect to the examples of embodiments above, a separation between adjacent individual package units can be relatively small, and thus decreased package sizes may be achieved.

FIG. 10A through FIG. 10H illustrate another manufacturing process of a semiconductor package according to some embodiments of the present disclosure. Although some drawings of FIG. 10A through FIG. 10H show manufacture of a single semiconductor device, the semiconductor device can be manufactured as part of a panel of semiconductor devices. Subsequent drawings may show singulation of semiconductor devices of the panel of semiconductor devices.

Figure 10A:
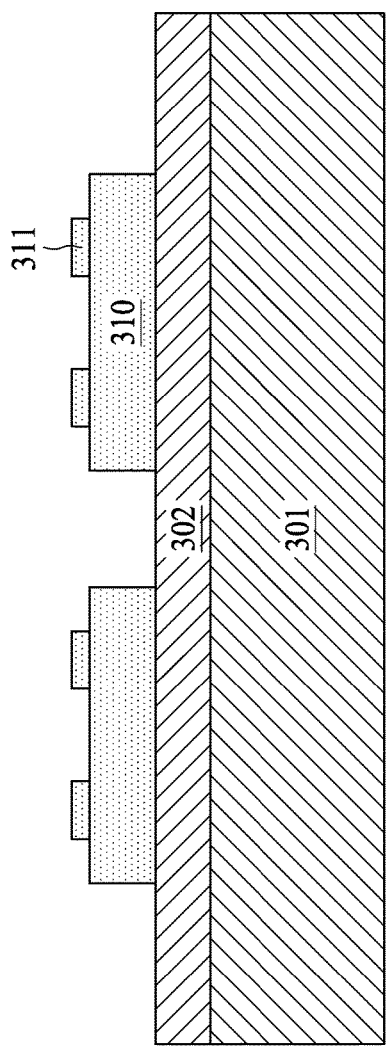
FIG. 10A, FIG. 10B, FIG. 10C, FIG. 10D, FIG. 10E, FIG. 10F, FIG. 10G, and FIG. 10H illustrate another manufacturing process of a semiconductor package according to some embodiments of the present disclosure.

As shown in FIG. 10A, a release film 302 is deposited, laminated, or coated onto a carrier 301. Semiconductor dies 310 are disposed with active surfaces face-up onto the release film 302. Metal contacts 311 are attached to, or are part of, each semiconductor die 310.

Figure 10B:
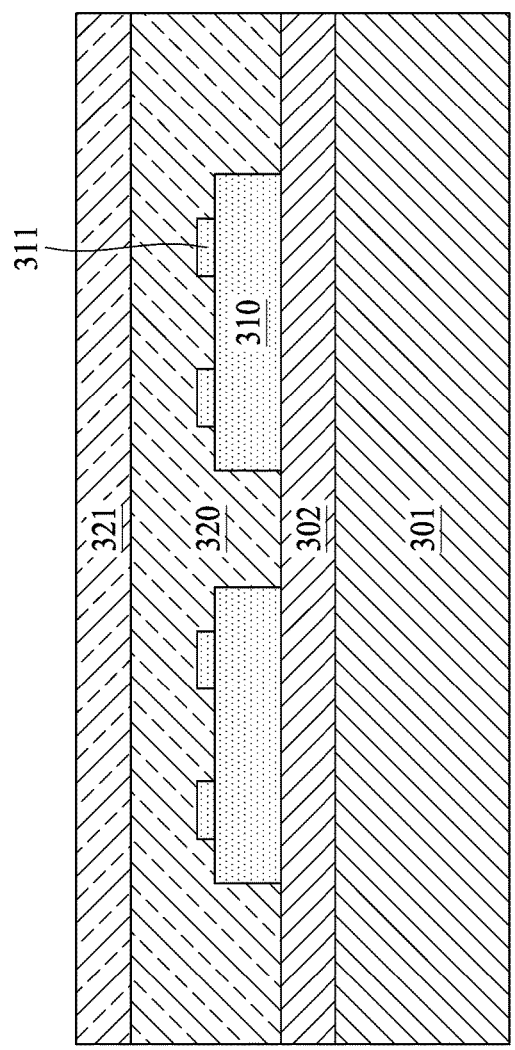

As shown in FIG. 10B, a molding tray 321 is positioned over the release film 302 above the semiconductor dies 310, and a molding compound 320 is applied under the molding tray 321, such that the molding compound 320 encases each semiconductor die 310.

Figure 10C:
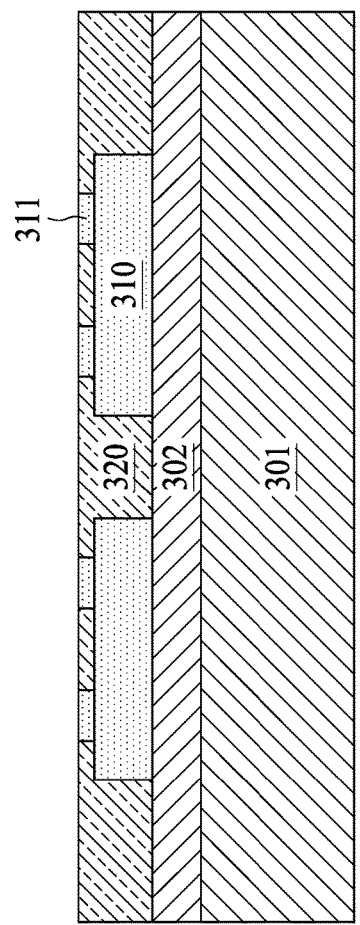

As shown in FIG. 10C, the molding tray 321 is removed. The molding compound 320 is grinded to expose the metal contacts 311.

Figure 10D:
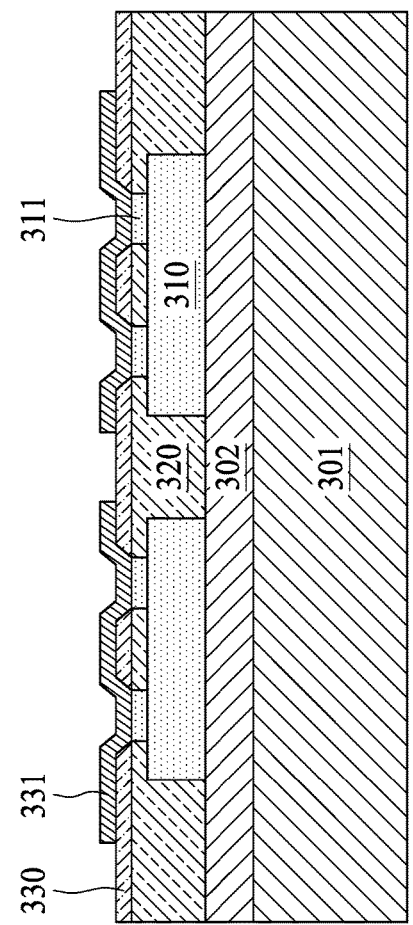

As depicted in FIG. 10D, a first redistribution layer including a first passivation layer 330 and a first metal layer 331 is disposed on the molding compound 320. The first passivation layer 330 exposes the metal contacts 311 of the semiconductor dies 310, and at least a portion of the first metal layer 331 is surrounded by the first passivation layer 330.

Figure 10E:
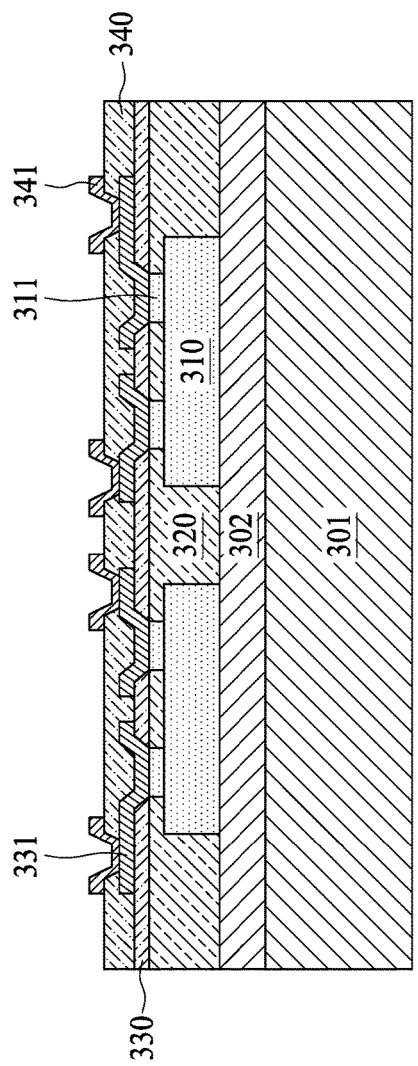

Next, as illustrated in FIG. 10E, a second redistribution layer is formed or disposed above the first redistribution layer. The second redistribution layer includes a second passivation layer 340 and a second metal layer 341. The second metal layer 341 may include a UBM layer such that the UBM layer is in electrical contact with the metal contacts 311 of the semiconductor dies 310.

Figure 10F:
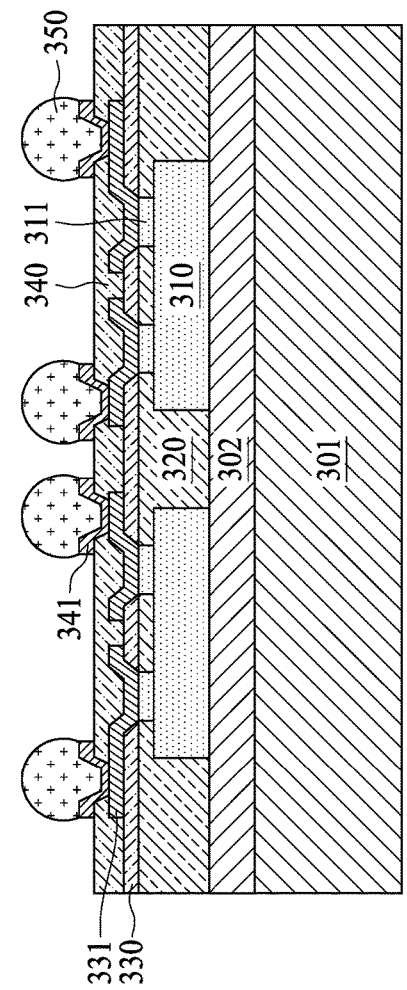

As depicted in FIG. 10F, solder balls 350 are disposed on the UBM layer to electrically connect to the redistribution layers.

Figure 10G:
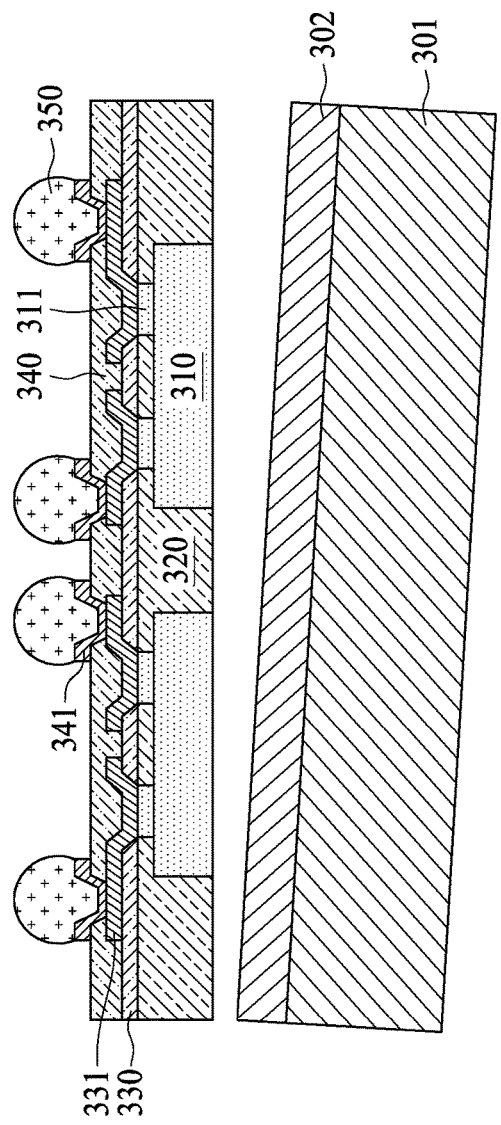

As shown in FIG. 10G, the carrier 301 and the release film 302 are removed.

Figure 10H:
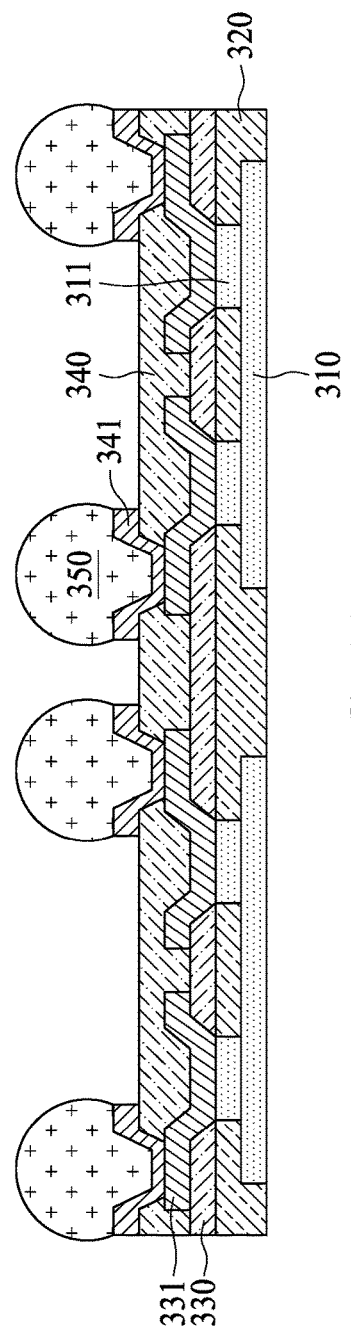

FIG. 10H illustrates a semiconductor package formed by cutting the panel into individual semiconductor packages using a panel saw.

As described above, the carrier 301 and the release film 302 are removed prior to separation of the panel. By this manufacturing process, warpage may be reduced. However, since the carrier 301 is not removed until the separation of the panel, a thickness of the panel can be large up until that stage of the manufacturing process, and thus some semiconductor machines may be unable to perform the manufacturing processes (e.g. when the thickness of the panel exceeds about 2 millimeters or the thickness of the carrier 301 exceeds about 1.3 millimeters). Additionally, the properties of materials of the carrier 301 may complicate the manufacturing process.

FIG. 11A through FIG. 11F illustrate another manufacturing process of a semiconductor package according to some embodiments of the present disclosure. Although some drawings of FIG. 11A through FIG. 11F show manufacture of a single semiconductor device, the semiconductor device can be manufactured as part of a panel of semiconductor devices. Subsequent drawings may show singulation of semiconductor devices of the panel of semiconductor devices.

As shown in FIG. 11A, a release film 302 is deposited, laminated, or coated onto a carrier 301. Semiconductor dies 310 are disposed with active surfaces face-up onto the release film 302. Metal contacts 311 are attached to, or are part of, each semiconductor die 310. A molding tray 321 is positioned over the release film 302 above the semiconductor dies 310, and a molding compound 320 is applied under the molding tray 321, such that the molding compound 320 encases each semiconductor die 310. The molding tray 321, carrier 301 and the release film 302 are then removed.

As depicted in FIG. 11B, a backside film 1101 is formed on the backside of the semiconductor dies 310.

Figure 11C:
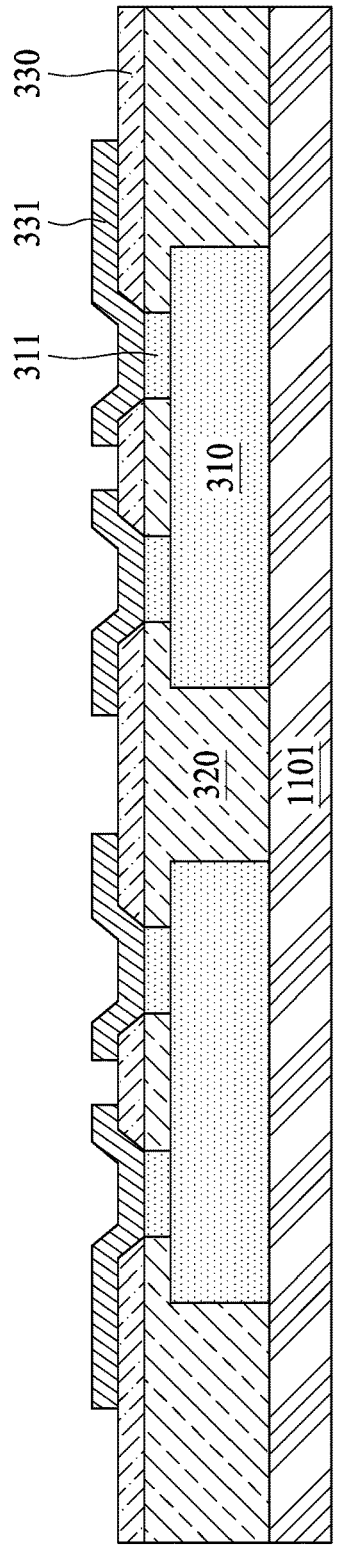

Afterwards, as shown in FIG. 11C, a first redistribution layer including a first passivation layer 330 and a first metal layer 331 is disposed on the molding compound 320. The first passivation layer 330 exposes the metal contacts 311 of the semiconductor dies 310, and at least a portion of the first metal layer 331 is surrounded by the first passivation layer 330.

Figure 11D:
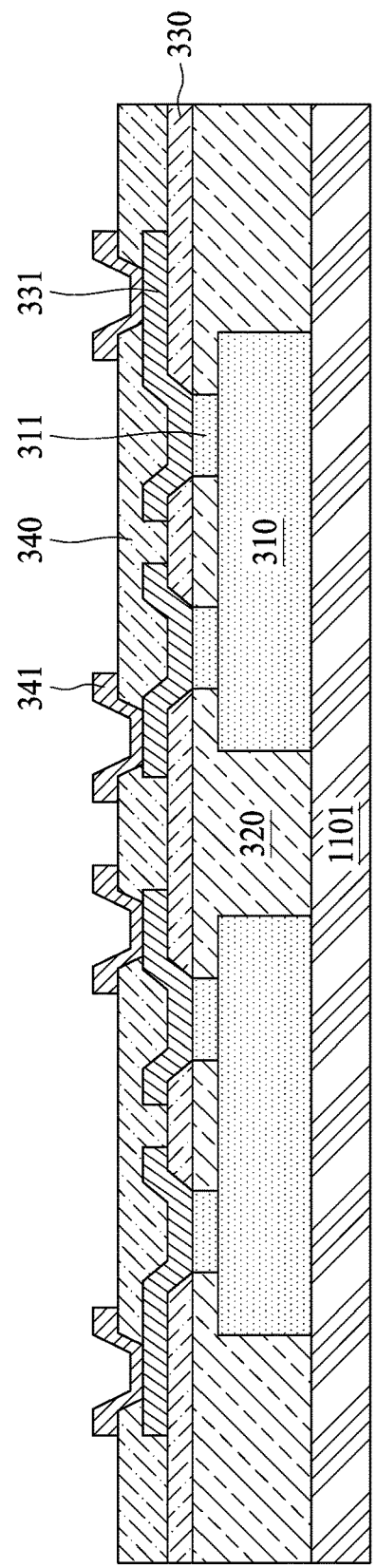

Next, as illustrated in FIG. 11D, a second redistribution layer including a second passivation layer 340 and a second metal layer 341 is formed or disposed above the first redistribution layer. The second metal layer 341 may include a UBM layer such that the UBM layer is in electrical contact with the metal contacts 311 of the semiconductor dies 310.

As depicted in FIG. 11E, solder balls 350 are disposed on the UBM layer to electrically connect to the redistribution layers. Subsequently, the panel is separated into individual semiconductor packages using a panel saw.

FIG. 11F shows a semiconductor package formed by the stages shown in FIG. 11A through FIG. 11E.

By this manufacturing process, since internal stress caused by the different thermal expansion coefficients of the backside film 1101 and the molding compound 320 may be reduced or avoided, warpage may be reduced. However, such manufacturing process may include more processes and increase the manufacturing costs as compared to other embodiments described herein. Moreover, the warpage improvement may be constrained by the properties of the backside film 1101. Further processes to control moisture absorption of the backside film 1101 may be implemented to avoid damage to the semiconductor package, which can be costly and/or increase a time of production.

FIG. 12A through FIG. 12G illustrate another manufacturing process of a semiconductor package according to some embodiments of the present disclosure. Although some drawings of FIG. 12A through FIG. 12G show manufacture of a single semiconductor device, the semiconductor device can be manufactured as part of a panel of semiconductor devices. Subsequent drawings may show singulation of semiconductor devices of the panel of semiconductor devices.

As shown in FIG. 12A, a release film 302 is deposited, laminated, or coated onto a carrier 301. Semiconductor dies 310 are disposed with active surfaces face-up onto the release film 302. Metal contacts 311 are attached to, or are part of, each semiconductor die 310. A molding tray is positioned over the release film 302 above the semiconductor dies 310, and a molding compound 320 is applied under the molding tray, such that the molding compound 320 encases each semiconductor die 310. The molding tray is removed. By grooving the molding compound 320 at or near the outer edges of the semiconductor dies 310, depressions 323 (e.g. trenches) are formed. The carrier 301 and the release film 302 are then removed.

As depicted in FIG. 12B, the molding compound 320 is grinded to expose the metal contacts 311.

Figure 12C:
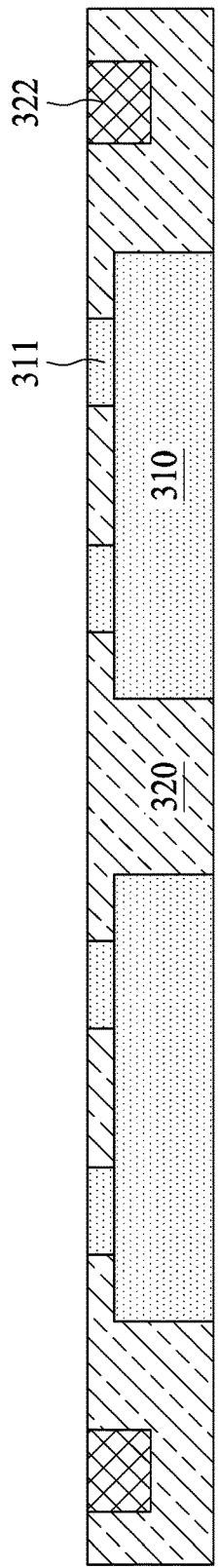

Afterwards, as shown in FIG. 12C, the depressions 323 are filled at least in part with a thermal release film or an UV light release film 322.

Figure 12D:
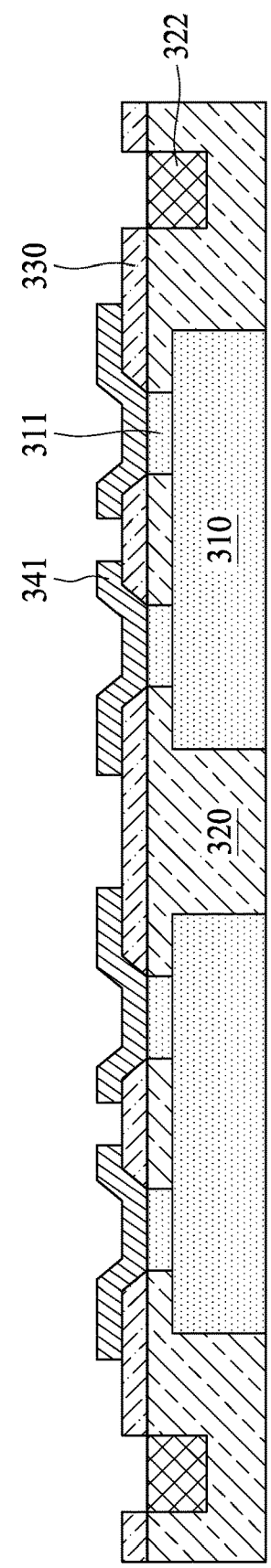

As shown in FIG. 12D, a first redistribution layer including a first passivation layer 330 and a first metal layer 331 is disposed on the molding compound 320. The first passivation layer 330 exposes the metal contacts 311 of the semiconductor dies 310, and at least a portion of the first metal layer 331 is surrounded by the first passivation layer 330.

Figure 12E:
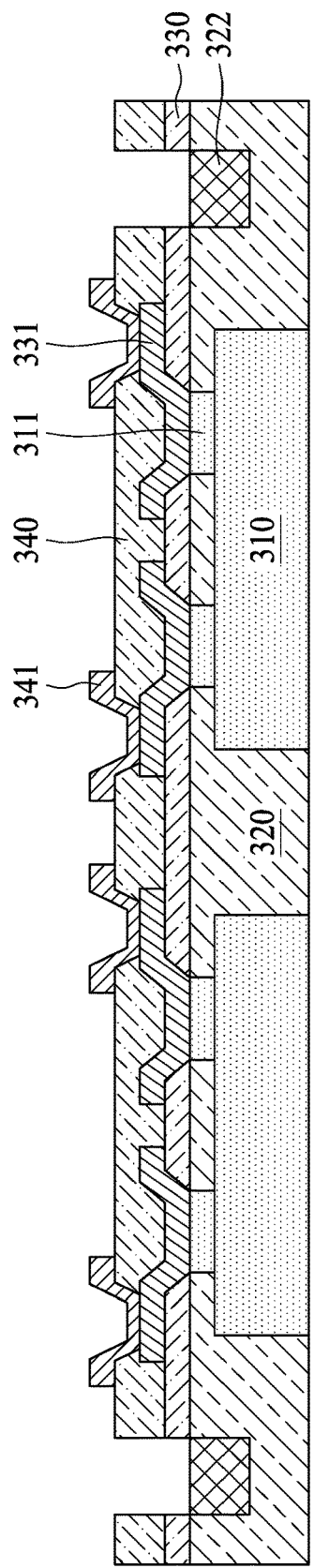

Next, as illustrated in FIG. 12E, a second redistribution layer is formed or disposed above the first redistribution layer. The second redistribution layer includes the second passivation layer 340 and the second metal layer 341. The second metal layer 341 may include a UBM layer such that the UBM layer is in electrical contact with the metal contacts 311 of the semiconductor dies 310.

Figure 12F:
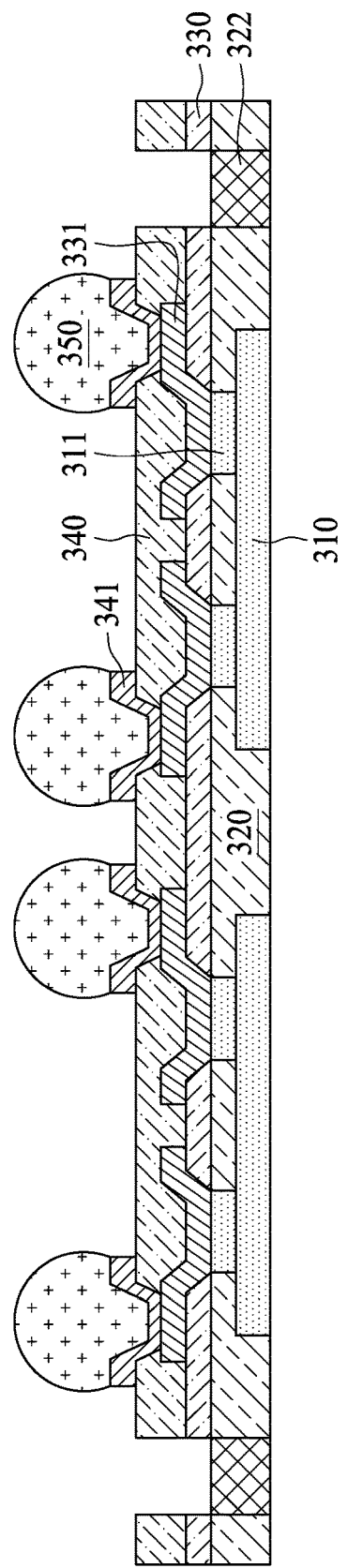

As depicted in FIG. 12F, solder balls 350 are disposed on the UBM layer to electrically connect to the redistribution layers.

Figure 12G:
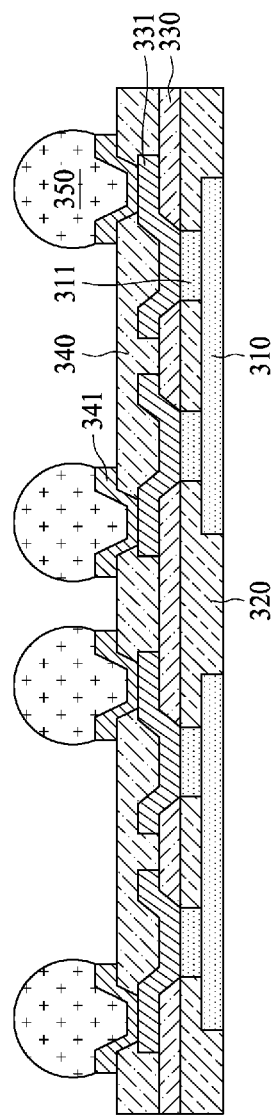

In FIG. 12G, thermal or UV energy is radiated on the thermal release film or the UV light release film 322, which decomposes the release film 322. A bottom surface of the semiconductor dies 310 is grinded, so as to separate the panel into individual semiconductor packages.

According to the above manufacturing process, the internal stress of the panel can be released due to the depressions 323 formed in the molding compound 320, thereby improving warpage of the semiconductor packages. However, such a manufacturing process may include more processes including the grooving and challenges may arise when separating the panel into individual semiconductor packages.

FIG. 13A through FIG. 13I illustrate another manufacturing process of a semiconductor package according to some embodiments of the present disclosure. Although some drawings of FIG. 13A through FIG. 13I show manufacture of a single semiconductor device, the semiconductor device can be manufactured as part of a panel of semiconductor devices. Subsequent drawings may show singulation of semiconductor devices of the panel of semiconductor devices.

Figure 13A:
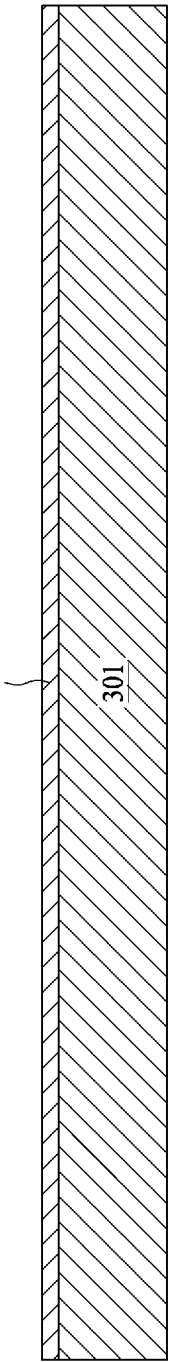

As shown in FIG. 13A, a release film 302 is deposited, laminated, or coated onto a carrier 301.

Figure 13B:
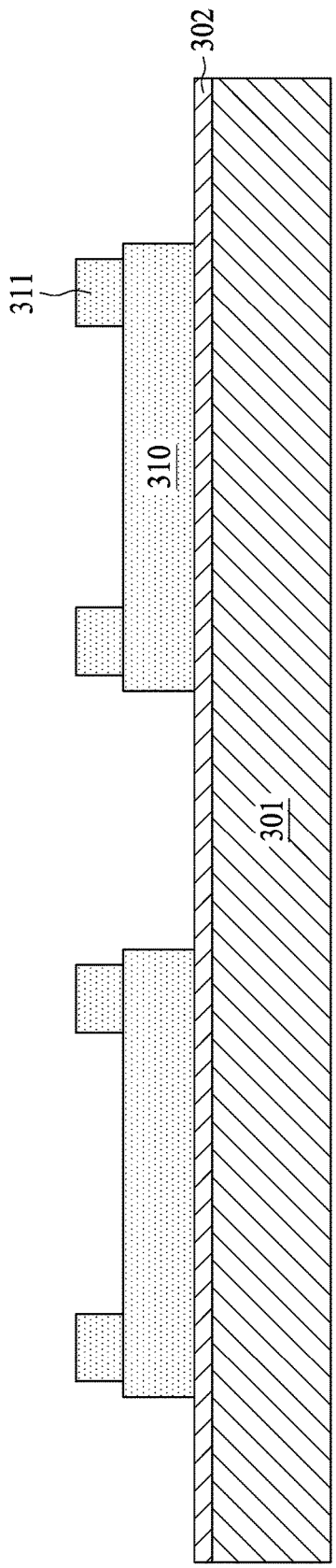

Next, as shown in FIG. 13B, semiconductor dies 310 are disposed with active surfaces face-up onto the release film 302. Metal contacts 311 are attached to, or are part of, each semiconductor die 310.

Figure 13C:
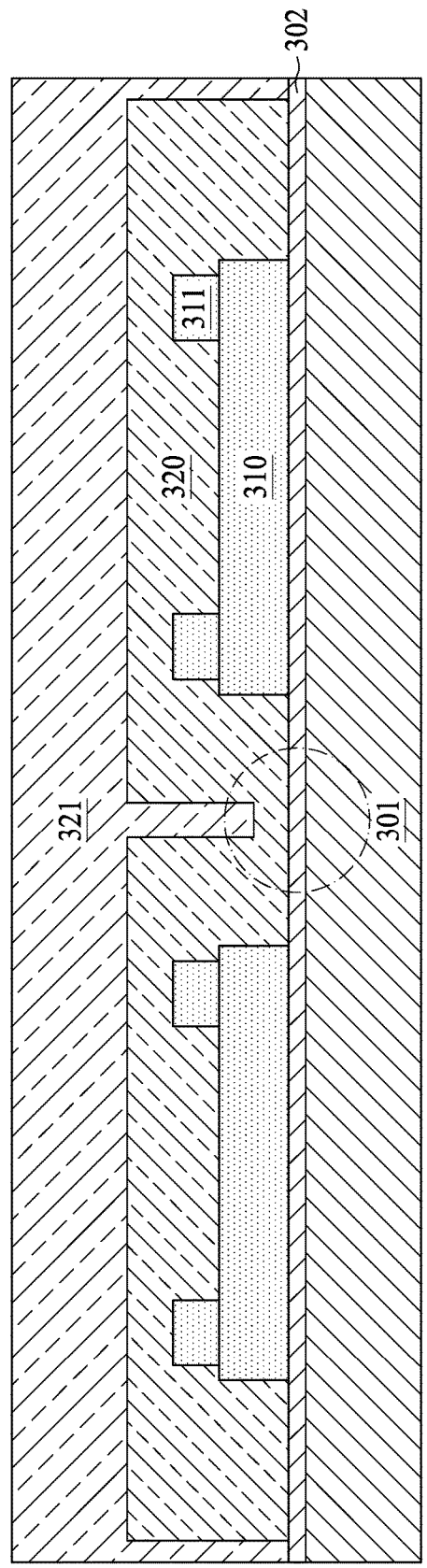

Afterwards, as depicted in FIG. 13C, a molding tray 321 is positioned on the carrier 301 over the semiconductor dies 310. The molding tray 321 is a structure designed to allow flowing of a molding compound 320 between the semiconductor dies 310. For example, the circle in dotted line in FIG. 13C illustrates a gap between the molding tray 321 and the release film 302 on the carrier 301. The molding compound 320 is applied into the molding tray 321, and flows from one cavity under the gap into an adjacent cavity. Accordingly, the molding compound 320 encases (encapsulates) each semiconductor die 310 under the molding tray 321. Outer, bottom edges of the molding tray 321 are in contact with outer edges of the panel, so that when the molding tray 321 is subsequently removed, a portion of the carrier 301 (previously in contact with the molding tray 321) will be visible from a top view (e.g., a portion of the carrier around a periphery of the panel when the molding tray 321 covers the entire panel, as shown in FIG. 1).

Then, as illustrated in FIG. 13D, the molding tray 321 is removed, and the carrier 301 along with the release film 302 are removed. After removal of the molding tray 321, depressions 323 defined by the molding compound 320 between adjacent semiconductor dies 310 are exposed, as shown by the depressions 323 between two semiconductor dies 310 in FIG. 13D.

As shown in FIG. 13E, a compound dry film 1310 may be deposited, laminated, or coated onto a backside of the panel where the carrier 301 and release film 302 were removed. The backside dry film 1310 may serve to reduce or minimize material stress and thus warpage of the semiconductor package (e.g. in subsequent stages of manufacture).

Next, as depicted in FIG. 13F, the molding compound 320 is partially removed to expose the metal contacts 311 of each semiconductor die 310.

Next, as shown in FIG. 13G, a first redistribution layer including a first passivation layer 330 and a first metal layer 331 is disposed on the molding compound 320. The first passivation layer 330 exposes the metal contacts 311 of the semiconductor dies 310, and at least a portion of the first metal layer 331 is surrounded by the first passivation layer 330. A second redistribution layer is formed or disposed above the first redistribution layer. The second redistribution layer includes a passivation layer 340 and a second metal layer 341. The second metal layer 341 may include a UBM layer such that the UBM layer is in electrical contact with the metal contacts 311 of the semiconductor dies 310.

Figure 13H:
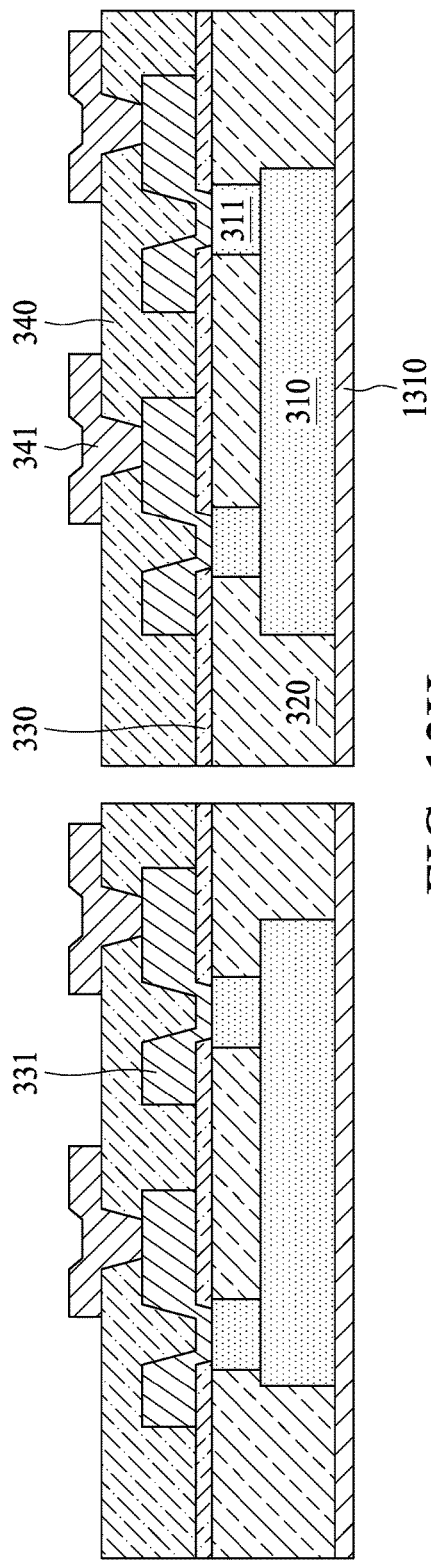

Then, as illustrated in FIG. 13H, individual packaged semiconductor dies 310 are separated from the panel (singulated) using a panel saw. To make a panel cut, the panel saw is positioned over one of the depressions 323 defined by the molding compound 320 between the semiconductor dies 310. The panel saw then cuts through the molding compound 320 below the depressions 323 and through the backside dry film 1310. Thus, a separate scribe line for guiding singulation may be omitted.

Figure 13I:
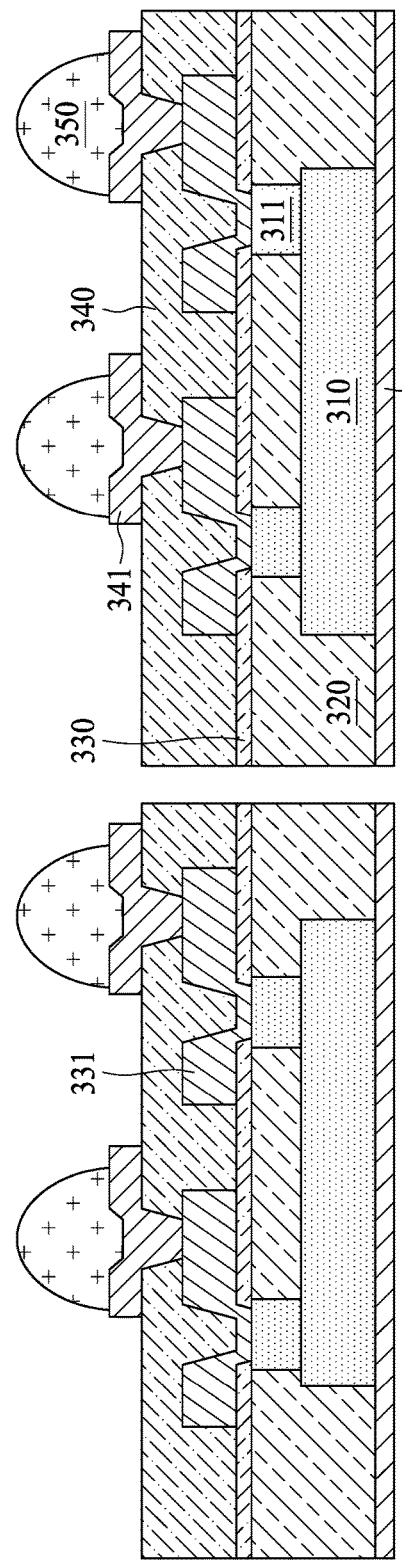

Finally, as depicted in FIG. 13I, solder balls 350 are disposed on the UBM layer to electrically connect to the redistribution layers.

FIG. 14A through FIG. 14G illustrate another manufacturing process of a semiconductor package according to some embodiments of the present disclosure. Although some drawings of FIG. 14A through FIG. 14G show manufacture of a single semiconductor device, the semiconductor device can be manufactured as part of a panel of semiconductor devices. Subsequent drawings may show singulation of semiconductor devices of the panel of semiconductor devices.

As shown in FIG. 14A, similar to the stage shown in FIG. 13A, a release film 302 is deposited, laminated, or coated onto a carrier 301.

As shown in FIG. 14B, a redistribution layer including a metal layer 331 and a passivation layer 330 is disposed on the release film 302 of the carrier 301, in a similar manner as described with respect to FIG. 13G.

Figure 14C:
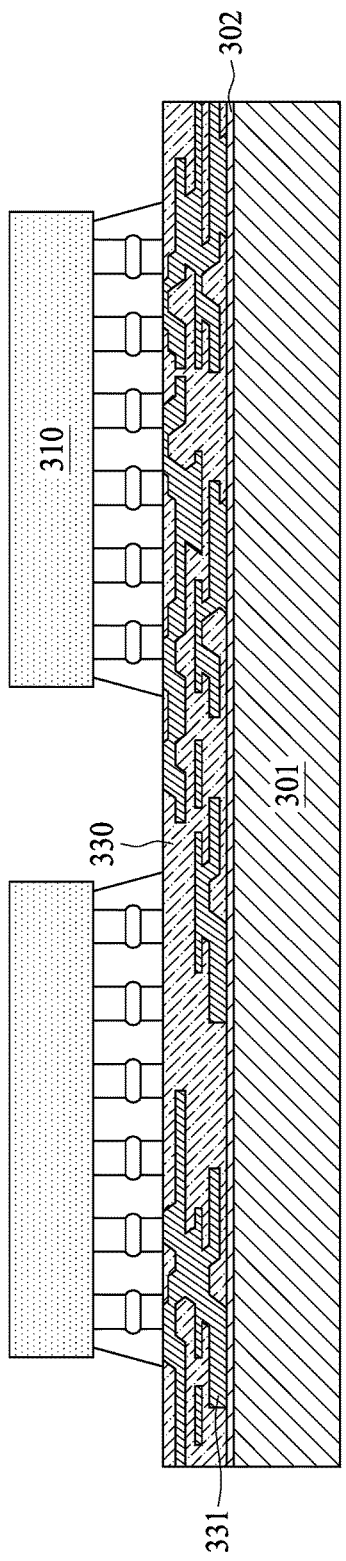

As shown in FIG. 14C, semiconductor dies 310 are disposed on the redistribution layer. The semiconductor dies 310 may also include a die attach and interconnects facing toward the redistribution layer. The die attach may include, for example, epoxy resin or dielectric materials. The semiconductor dies 310 may be positioned over the redistribution layer 330 such that the interconnects align with conductive vias in, or pads of, the redistribution layer.

Figure 14D:
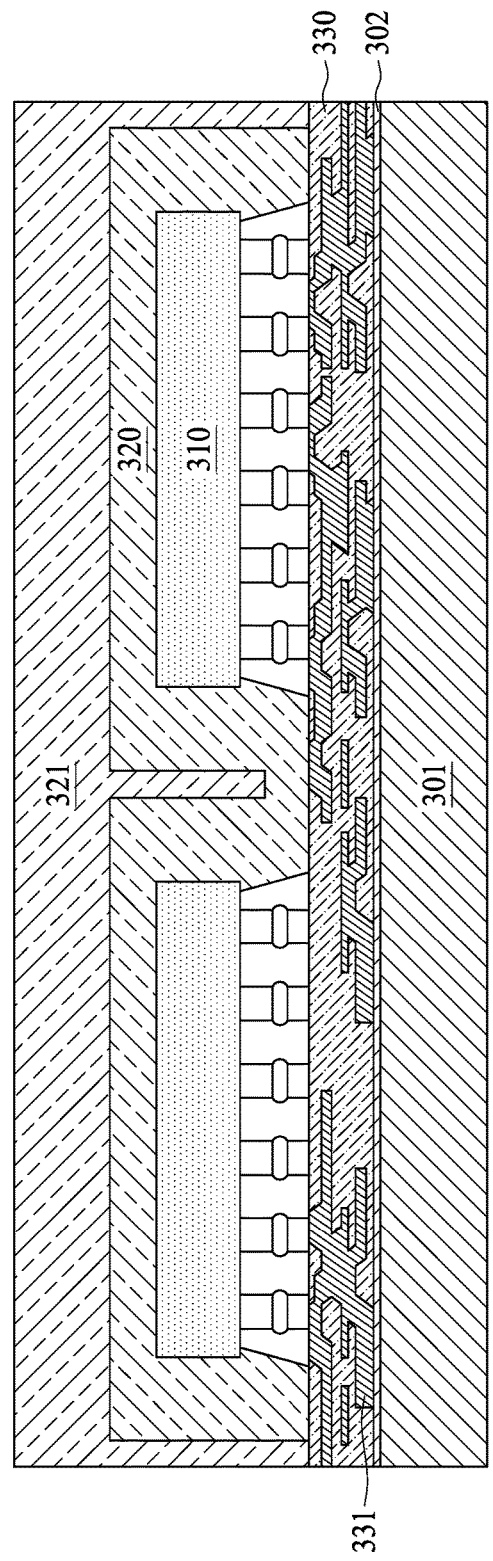

As shown in FIG. 14D, a molding tray 321 is disposed on the redistribution layer over the semiconductor dies 310. A molding compound 320 is applied to underfill the molding tray 321. The molding tray 321 is structured to leave depressions 323 defined by the molding compound 320 between the semiconductor dies 310. The molding compound 320 is applied such that it encases each semiconductor die 310 under the molding tray 321.

As shown in FIG. 14E, the molding tray 321 is removed and the carrier 301 along with the release film 302 are removed. After removal of the molding tray 321, depressions 323 between the semiconductor dies 310 are exposed.

As shown in FIG. 14F, the panel is singulated along the depressions 323 using a panel saw, as discussed with respect to FIG. 13H. Because the panel saw is positioned within the depressions 323 during sawing, scribe lines may be omitted.

Figure 14G:
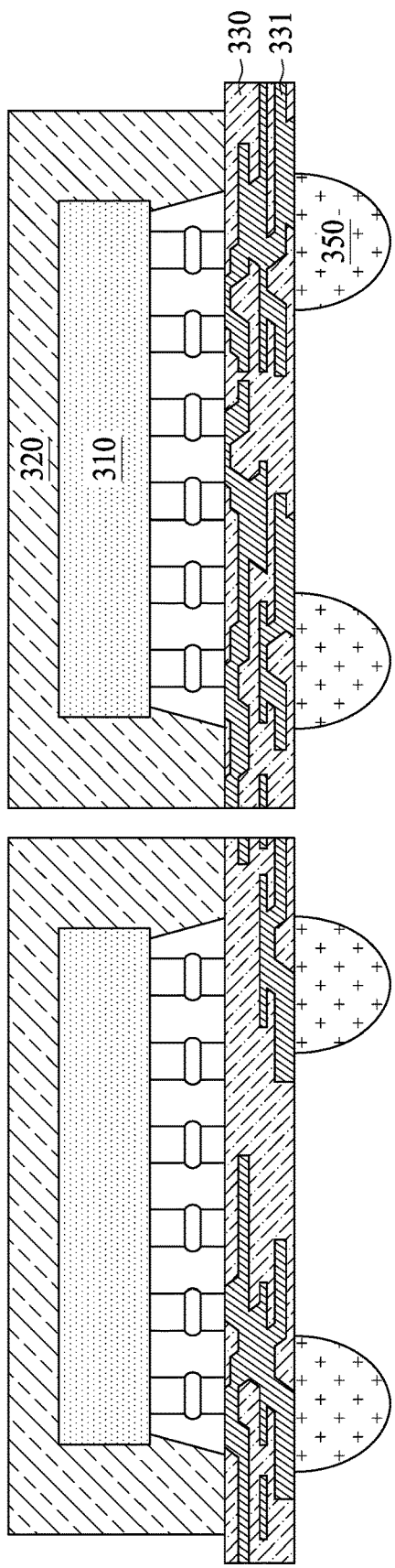

As shown in FIG. 14G, solder balls 350 or other interconnections are mounted onto exposed ends of conductive vias or pads in the redistribution layer.

Figure 15:
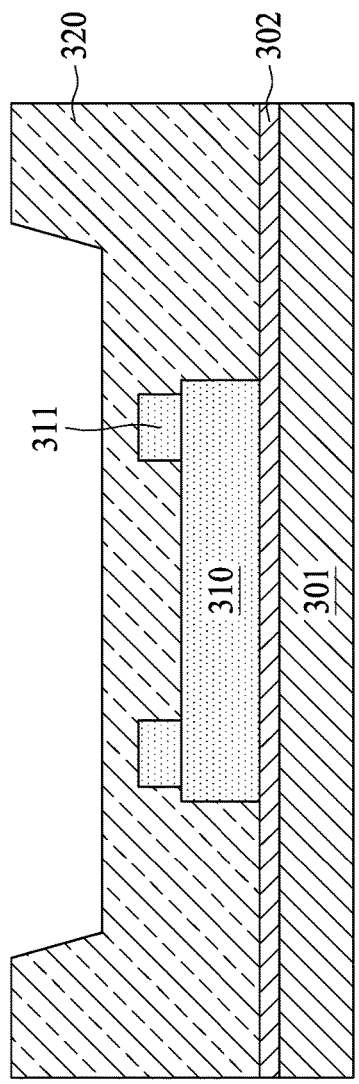
FIG. 15 illustrates an example of a portion of a semiconductor package panel in a cross-section view.

FIG. 15 illustrates an example of a portion of a semiconductor package panel in cross-section, showing the molding compound 320 raised at a periphery of the panel and at a periphery of the individual units, forming a ring-shaped bar around the individual units and around the panel. A release film 302 is deposited, laminated, or coated onto a carrier 301. Semiconductor dies 310 are disposed with active surfaces face-up onto the release film 302. Metal contacts 311 are attached to, or are part of, each semiconductor die 310, and the molding compound 320 is applied, such that the molding compound 320 encases each semiconductor die 310, as shown in FIG. 15.

Figure 16:
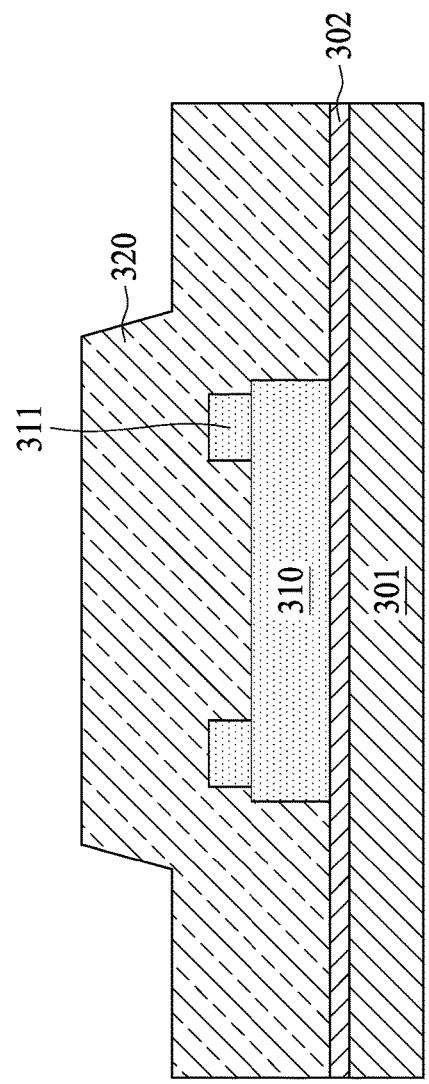
FIG. 16 illustrates another example of a portion of a semiconductor package panel in a cross-section view.

FIG. 16 illustrates an example of a portion of a semiconductor package panel in cross-section, showing the molding compound 320 lowered at a periphery of the panel and at a periphery of an individual unit, forming a ring-shaped dent around the individual unit and around the panel. A release film 302 is deposited, laminated, or coated onto a carrier 301. Semiconductor dies 310 are disposed with active surfaces face-up onto the release film 302. Metal contacts 311 are attached to, or are part of, each semiconductor die 310, and the molding compound 320 is applied, such that the molding compound 320 encases each semiconductor die 310, as shown in FIG. 16.

FIG. 17A through FIG. 17F illustrate a manufacturing process for fabricating a panel incorporating a ring-shaped bar around a periphery of the panel, and further incorporating dents or depressions between individual units. Although some drawings of FIG. 17A through FIG. 17F show manufacture of a single semiconductor device, the semiconductor device can be manufactured as part of a panel of semiconductor devices. Subsequent drawings may show singulation of semiconductor devices of the panel of semiconductor devices.

Figure 17A:
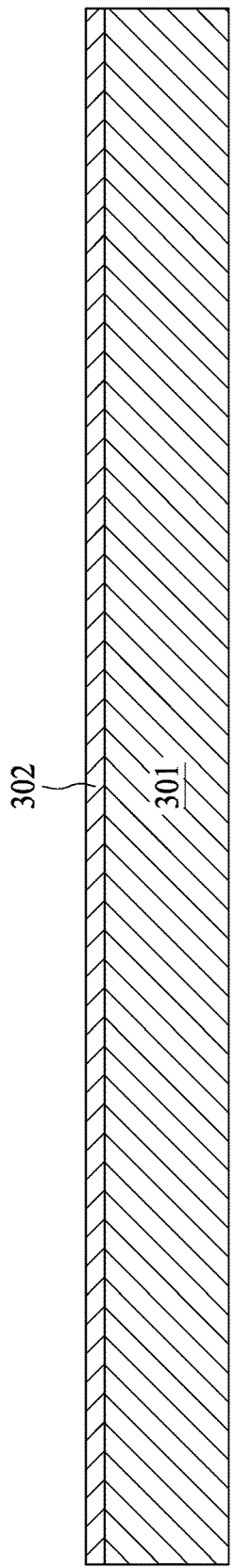

As shown in FIG. 17A, a carrier 301 is provided, and the carrier 301 includes a release film 302, or a release film 302 is laminated onto the carrier 301.

Figure 17B:
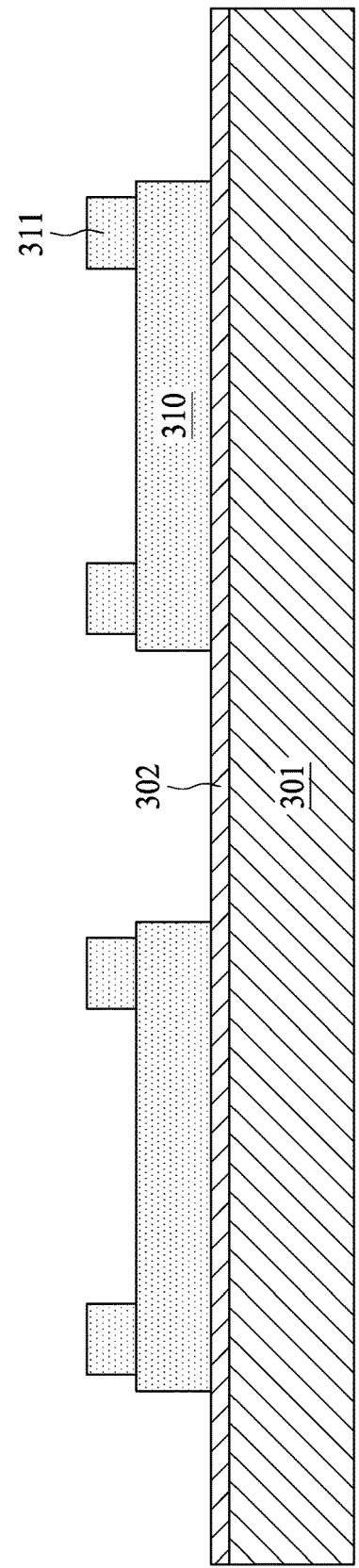

As shown in FIG. 17B, semiconductor dies 310 are disposed on the release film 302. Metal contacts 311 are attached to, or are part of, each semiconductor die 310.

As shown in FIG. 17C, a molding tray 321 is positioned over the semiconductor dies 310 An indentation in the molding tray 321 (e.g. a section of the molding tray 321 that is thinner than other sections of the molding tray 321) is disposed above and around a periphery of the panel (which provides for formation of a ring bar), and protrusions of the molding tray 321 that extend towards the carrier 301 are respectively disposed between the semiconductor dies 310 (which provide for formation of depressions 323).

As shown in FIG. 17D, a molding compound 320 is applied under the molding tray 321 and encapsulates the semiconductor dies 310. The molding tray 321 is removed, leaving the molding compound 320 including a ring bar structure around the periphery of the panel and depressions 323 between the semiconductor dies 310.

Figure 17E:
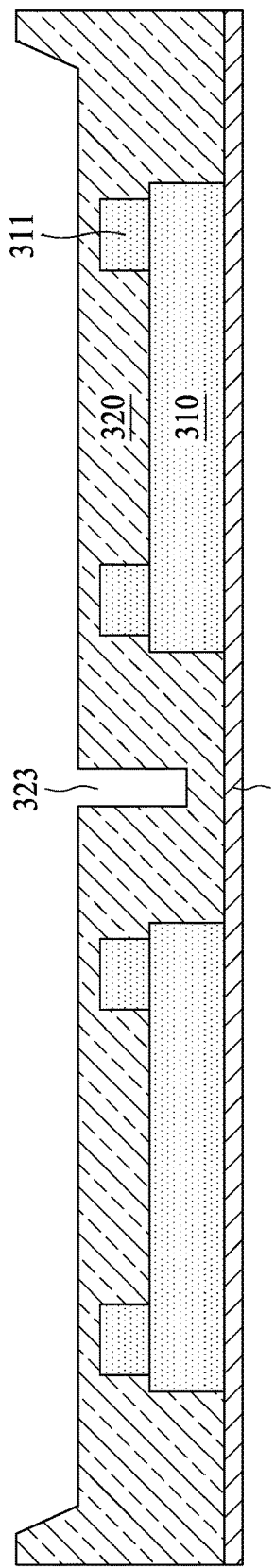

As shown in FIG. 17E, a compound dry film 1710 is laminated on the backside of the panel to further reduce warpage of the panel. The front side of the panel is ground down to expose electrical contacts of the semiconductor dies 310 from the molding compound 320.

Figure 17F:
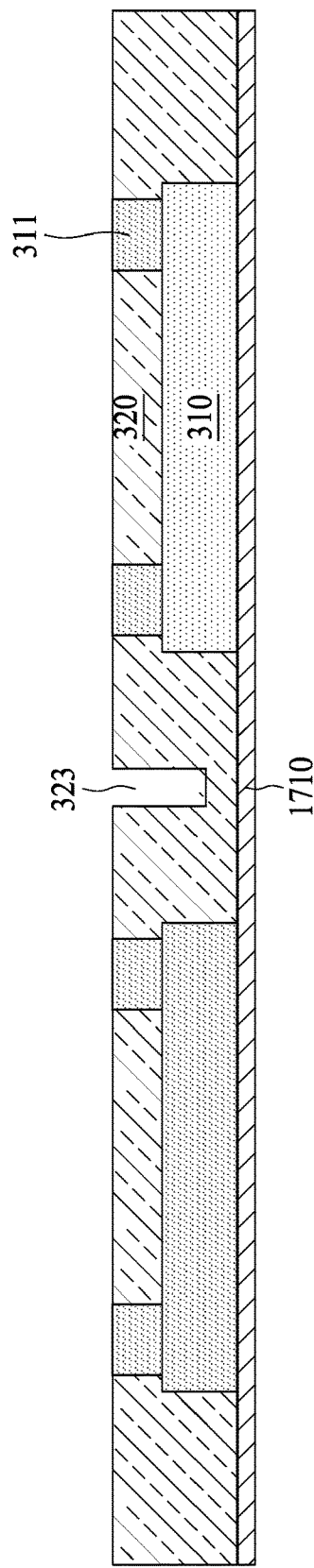

As shown in FIG. 17F, the metal contacts 311 are exposed by grinding the molding compound 320.

This approach can provide for reduced or minimized warpage of the semiconductor package.

Figure 18A:
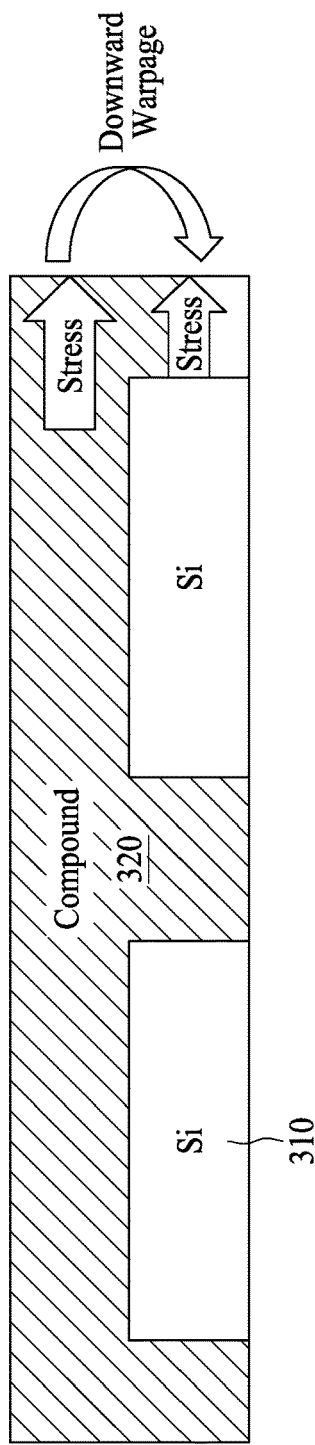
FIG. 18A, FIG. 18B, and FIG. 18C show warpage during a manufacturing process of some embodiments of a semiconductor package.
Figure 18C:
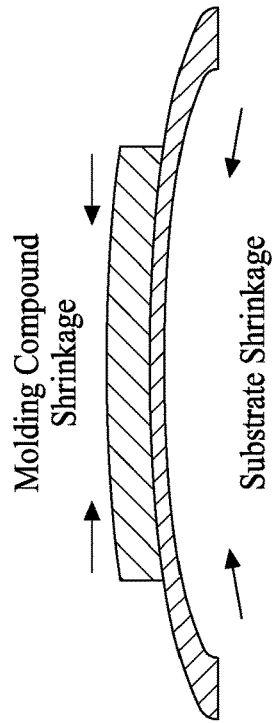
Figure 18B:
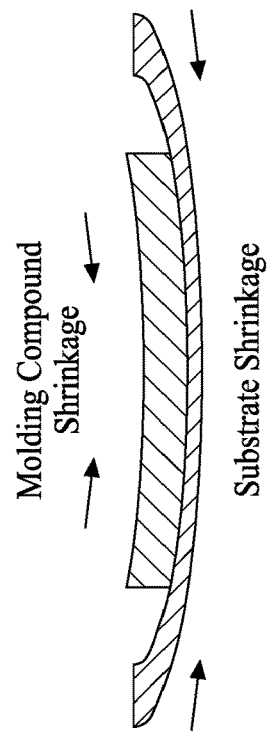

FIG. 18A through FIG. 18C show warpage during a manufacturing process of a semiconductor package.

FIG. 18A illustrates an intermediate stage of manufacturing a semiconductor package including two semiconductor dies 310 (which can include silicon (Si)) partially encompassed by a molding compound 320.

Wafer level packages can include one or more encapsulated semiconductor dies. In some instances, different portions of a semiconductor package experience mechanical stresses of different magnitudes and directions during manufacture. For example, referring to FIG. 18A, a stress differential between a bottom portion of the semiconductor package including the semiconductor dies 310 and a top portion of the semiconductor package that includes predominantly a molding compound 320 may cause the semiconductor package to warp. The semiconductor package may deform in a manner such that two opposing lateral edges of the semiconductor package may droop downward with respect to a center of the semiconductor package (e.g., as shown by the indication of "downward warpage" in FIG. 18A), or the lateral edges may rise up, instead of drooping down, with respect to the center of the semiconductor package, causing the semiconductor package to warp upward.

FIG. 18B and FIG. 18C show two types of warpage. The warpage may be caused by a stress differential between the molding compound 320 and the substrate (or the panel). As depicted in FIG. 18B, the shrinkage rate of the molding compound 320 is greater than the shrinkage rate of the substrate. That is, the molding compound 320 has an internal stress greater than an internal stress of the substrate, which may cause a concave warpage. On the other hand, in FIG. 18C, the shrinkage rate of the molding compound 320 is less than the shrinkage rate of the substrate, and the molding compound 320 has an internal stress less than an internal stress of the substrate. Accordingly, a convex warpage may be formed. The present disclosure provides for improved semiconductor device packages and method of manufacturing semiconductor device packages that can reduce or avoid such warpage.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing a semiconductor device package, comprising:
   providing a carrier having a predetermined area;
   disposing a semiconductor device on the predetermined area;
   forming a sacrificial wall on a periphery of the predetermined area, the sacrificial wall comprising a polymer material; and
   removing the sacrificial wall.

2. The method of claim 1, wherein removing the sacrificial wall is performed by at least one of an optical technique, a mechanical technique, a thermal technique or a chemical technique.

3. The method of claim 1, further comprising forming an encapsulant covering the semiconductor device prior to the formation of the sacrificial wall.

4. The method of claim 3, further comprising forming a cavity in the encapsulant to accommodate the sacrificial wall.

5. The method of claim 4, wherein the cavity is formed such that a sidewall defining the cavity and a bottom defining the cavity forms an angle in a range from approximately 45 degrees to approximately 90 degrees.

6. The method of claim 1, further comprising:
   forming an encapsulant covering the semiconductor device; and
   removing the carrier.

7. The method of claim 6, further comprising disposing an adhesive film on the encapsulant subsequent to removing the carrier.

8. The method of claim 7, further comprising applying an expanding force on the encapsulant.

9. The method of claim 1, further comprising forming an encapsulant covering the semiconductor device subsequent to forming the sacrificial wall.

10. The method of claim 9, further comprising removing the carrier.

11. The method of claim 10, further comprising removing the sacrificial wall.

12. The method of claim 11, further comprising disposing a first adhesive film on a first surface of the encapsulant, and disposing a second adhesive film on a second surface of the encapsulant, wherein the second surface is opposite to the first surface.

13. The method of claim 7, further comprising applying a force in a first direction on the adhesive film.

14. The method of claim 7, further comprising removing the adhesive film to form the semiconductor device package.

15. The method of claim 7, further comprising cutting the encapsulant to form the semiconductor device package.

16. The method of claim 10, wherein the encapsulant has a first surface, the method further comprising forming a first adhesive film on the first surface of the encapsulant subsequent to removing the carrier.

17. The method of claim 16, further comprising removing the sacrificial wall to form the semiconductor device package.

18. The method of claim 17, wherein the encapsulant has a second surface opposite to the first surface, the method further comprising forming a second adhesive film on the second surface of the encapsulant.

19. The method of claim 18, further comprising removing the first adhesive film to form the semiconductor device package.

* * * * *